(12) United States Patent
Chen et al.

(10) Patent No.: US 11,824,549 B2
(45) Date of Patent: Nov. 21, 2023

(54) REFERENCE VOLTAGE BUFFER CIRCUIT

(71) Applicant: SHENZHEN GOODIX TECHNOLOGY CO., LTD., Shenzhen (CN)

(72) Inventors: Junxi Chen, Shenzhen (CN); Zhengfeng Wang, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 289 days.

(21) Appl. No.: 17/494,494

(22) Filed: Oct. 5, 2021

(65) Prior Publication Data

US 2022/0149857 A1    May 12, 2022

Related U.S. Application Data

(63) Continuation of application No. PCT/CN2020/128465, filed on Nov. 12, 2020.

(51) Int. Cl.
| | |
|---|---|
| H03M 1/08 | (2006.01) |
| H03F 3/45 | (2006.01) |
| H03M 1/80 | (2006.01) |
| H03M 1/46 | (2006.01) |
| G05F 1/575 | (2006.01) |
| G05F 1/595 | (2006.01) |

(Continued)

(52) U.S. Cl.
CPC .......... *H03M 1/0863* (2013.01); *G05F 1/575* (2013.01); *G05F 1/595* (2013.01); *H03F 3/45475* (2013.01); *H03F 3/505* (2013.01); *H03M 1/46* (2013.01); *H03M 1/804* (2013.01); *H03M 1/38* (2013.01)

(58) Field of Classification Search
CPC ...... H03M 1/0863; H03M 1/46; H03M 1/804; H03M 1/38; H03F 3/45475; H03F 3/505; G05F 1/575; G05F 1/595
USPC ........................................................ 341/136
See application file for complete search history.

(56) References Cited

U.S. PATENT DOCUMENTS

| | | | |
|---|---|---|---|
| 7,116,163 B2 | 10/2006 | Kappes | |
| 10,699,758 B2 | 6/2020 | Kim | |
| 2006/0022754 A1 | 2/2006 | Kappes | |

(Continued)

FOREIGN PATENT DOCUMENTS

| | | |
|---|---|---|
| CN | 1378283 A | 11/2002 |
| CN | 202548685 U | 11/2012 |

(Continued)

*Primary Examiner* — Khai M Nguyen

(57) ABSTRACT

A reference voltage buffer circuit is provided, which could improve the reliability of the reference voltage buffer circuit, including: at least one output branch, where each output branch includes a delay control branch, a first MOSFET, and a second MOSFET; and a feedback branch, where in a first time period, the feedback branch is configured to output a first voltage to the delay control branch, and the delay control branch is configured to control the first MOSFET and the second MOSFET to be turned on, such that a source of the first MOSFET continuously outputs a reference voltage; and in a second time period, a voltage output from the feedback branch to the delay control branch is 0, the delay control branch is configured to control the second MOSFET to be turned off before the first MOSFET is turned off.

20 Claims, 6 Drawing Sheets

(51) Int. Cl.
*H03F 3/50* (2006.01)
*H03M 1/38* (2006.01)

(56) References Cited

U.S. PATENT DOCUMENTS

| | | | | |
|---|---|---|---|---|
| 2009/0195302 A1* | 8/2009 | Lin | ............... | H03F 3/505 |
| | | | | 327/543 |
| 2009/0315531 A1* | 12/2009 | Liao | ............... | G05F 1/56 |
| | | | | 323/312 |
| 2020/0013440 A1 | 1/2020 | Kim | | |

FOREIGN PATENT DOCUMENTS

| | | |
|---|---|---|
| CN | 102946204 A | 2/2013 |
| CN | 108322215 A | 7/2018 |
| CN | 110675899 A | 1/2020 |
| TW | I499883 B | 9/2015 |

* cited by examiner

REFERENCE VOLTAGE BUFFER CIRCUIT

CROSS REFERENCE TO RELATED APPLICATIONS

This application is a continuation of International Application No. PCT/CN2020/128465, filed on Nov. 12, 2020, the disclosure of which is hereby incorporated by reference in its entirety.

TECHNICAL FIELD

Embodiments of the present application relate to the field of electronics, and more specifically, to a reference voltage buffer circuit.

BACKGROUND

In order to obtain a higher energy efficiency, a capacitive successive-approximation register (SAR) architecture is often used in the design of medium-speed and high-speed, medium-precision and high-precision analog-to-digital converter (ADC). However, when each bit in a SAR algorithm is generated, a capacitor digital-to-analog converter (CDAC) needs to extract some charges related to a signal from a reference voltage. If a reference voltage of an ADC is not completely established, the establishment error will be directly introduced into an output of the ADC and cause harmonic distortion of an output result. Therefore, in order to reduce the harmonic distortion caused by the establishment error of the reference voltage, a reference voltage buffer circuit is often introduced to enhance a driving capability of the reference voltage. However, how to design a more reliable reference voltage buffer circuit has become an urgent problem to be solved at present.

SUMMARY

The present application provides a reference voltage buffer circuit, which could improve the reliability of the reference voltage buffer circuit.

According to a first aspect, a reference voltage buffer circuit is provided, where the reference voltage buffer circuit includes: at least one output branch, where each of the at least one output branch includes a delay control branch, a first Metal-Oxide-Semiconductor Field-Effect Transistor (MOSFET) and a second MOSFET; and a feedback branch, where a first terminal of the feedback branch is connected to a first terminal of the delay control branch, a second terminal of the feedback branch is connected to a power supply, a second terminal of the delay control branch is connected to a gate of the first MOSFET, a third terminal of the delay control branch is connected to a gate of the second MOSFET, a source of the second MOSFET is connected to the power supply, and a drain of the second MOSFET is connected to a drain of the first MOSFET.

In a first time period, the first terminal of the feedback branch is configured to output a first voltage to the delay control branch, and the delay control branch is configured to control, on the basis of the first voltage, the first MOSFET and the second MOSFET to be turned on, such that a source of the first MOSFET continuously outputs a reference voltage; and in a second time period after the first time period, a voltage output from the first terminal of the feedback branch to the delay control branch is 0, the delay control branch is configured to control the first MOSFET to be turned off, and to control the second MOSFET to be turned off before the first MOSFET is turned off, and a voltage output by the source of the first MOSFET is 0.

Therefore, according to the reference voltage buffer circuit in this embodiment of the present application, when the circuit is powered down, and the voltage of the node connected to the feedback branch drops to a low level, the delay control branch can control the second MOSFET to be turned off before the first MOSFET, that is, after the circuit is powered down, the node between the drain of the first MOSFET and the drain of the second MOSFET has a discharge channel, and the voltage of this node can be quickly reduced to 0, thereby reducing the overvoltage risk of the first MOSFET.

With reference to the first aspect, in an implementation of the first aspect, the delay control branch includes a first NAND gate and a delay component, where a first input terminal of the first NAND gate is the first terminal of the delay control branch, a second input terminal of the first NAND gate is the second terminal of the delay control branch, an output terminal of the first NAND gate is the third terminal of the delay control branch, and the delay component is disposed between the first input terminal of the first NAND gate and the second input terminal of the first NAND gate.

With reference to the first aspect and the foregoing implementations of the first aspect, in another implementation of the first aspect, the delay component includes a resistor and a capacitor, the resistor is disposed between the first input terminal of the first NAND gate and the second input terminal of the first NAND gate, a first terminal of the capacitor is connected to the second input terminal of the first NAND gate, and a second terminal of the capacitor is grounded.

With reference to the first aspect and the foregoing implementations of the first aspect, in another implementation of the first aspect, each output branch further includes a load resistor, where a first terminal of the load resistor is grounded, and a second terminal of the load resistor is connected to the source of the first MOSFET.

With reference to the first aspect and the foregoing implementations of the first aspect, in another implementation of the first aspect, the first MOSFET is an N-type MOSFET, and the second MOSFET is a P-type MOSFET.

With reference to the first aspect and the foregoing implementations of the first aspect, in another implementation of the first aspect, the feedback branch includes a first operational amplifier, a current source, a third MOSFET, a fourth MOSFET and a fifth MOSFET, where a gate of the third MOSFET is connected to a drain of the fifth MOSFET, is connected to an output terminal of the first operational amplifier, and is the first terminal of the feedback branch; a source of the third MOSFET is connected to the current source and is connected to an inverting input terminal of the first operational amplifier; a drain of the third MOSFET is connected to a drain of the fourth MOSFET; a gate of the fourth MOSFET is connected to the gate of the second MOSFET; a source of the fourth MOSFET is connected to the power supply; and a source of the fifth MOSFET is grounded.

in the first time period, a gate of the fifth MOSFET is configured to receive a first signal such that the fifth MOSFET is turned off, and the first operational amplifier is configured to control the gate of the third MOSFET to output the first voltage; and in the second time period, the gate of the fifth MOSFET is configured to receive a second signal such that the fifth MOSFET is turned on, the output terminal of the first operational amplifier is turned off, and the third MOSFET is turned off.

With reference to the first aspect and the foregoing implementations of the first aspect, in another implementation of the first aspect, the first signal is a low-level signal, and the second signal is a high-level signal.

With reference to the first aspect and the foregoing implementations of the first aspect, in another implementation of the first aspect, an input voltage of a non-inverting input terminal of the first operational amplifier is equal to the reference voltage.

With reference to the first aspect and the foregoing implementations of the first aspect, in another implementation of the first aspect, the feedback branch further includes a voltage limiting branch, a first terminal of the voltage limiting branch is connected to the gate of the third MOSFET, and a second terminal of the voltage limiting branch is connected to the source of the third MOSFET; and the voltage limiting branch is configured to limit a gate voltage of the third MOSFET in the first time period according to a source voltage of the third MOSFET.

With reference to the first aspect and the foregoing implementations of the first aspect, in another implementation of the first aspect, the voltage limiting branch includes a second operational amplifier and a sixth MOSFET, where an inverting input terminal of the second operational amplifier is connected to an output terminal of the second operational amplifier and is connected to a drain of the sixth MOSFET, a source of the sixth MOSFET is the first terminal of the voltage limiting branch, and a gate of the sixth MOSFET is the second terminal of the voltage limiting branch; in the first time period, if the sixth MOSFET is turned on, the second operational amplifier is configured to limit the gate voltage of the third MOSFET; and in the second time period, the output terminal of the second operational amplifier is turned off.

With reference to the first aspect and the foregoing implementations of the first aspect, in another implementation of the first aspect, an input voltage of a non-inverting input terminal of the second operational amplifier is equal to the reference voltage.

With reference to the first aspect and the foregoing implementations of the first aspect, in another implementation of the first aspect, the feedback branch further includes: a status control branch; and a first terminal of the status control branch, the drain of the third MOSFET and the drain of the fourth MOSFET are connected, a second terminal of the status control branch is connected to the gate of the fourth MOSFET, and a third terminal of the status control branch, the third terminal of the delay control branch and the gate of the second MOSFET are connected.

In the first time period, the status control branch is configured to control, according to the first signal, the fourth MOSFET to be turned on, such that the drain of the third MOSFET is connected to the power supply via the fourth MOSFET; and in the second time period, the status control branch is configured to control, according to the second signal, the drain of the fourth MOSFET and the drain of the third MOSFET to be grounded.

With reference to the first aspect and the foregoing implementations of the first aspect, in another implementation of the first aspect, the at least one output branch is one output branch, and the status control branch includes: a seventh MOSFET, a second NAND gate and a second inverter; a source of the seventh MOSFET is grounded, a drain of the seventh MOSFET is the second terminal of the status control branch, a gate of the seventh MOSFET is connected to an output terminal of the second NAND gate, the output terminal of the second NAND gate is the first terminal of the status control branch, a first input terminal of the second NAND gate is connected to an output terminal of the second inverter, and an input terminal of the second inverter is the third terminal of the status control branch; in the first time period, an input signal of a second input terminal of the second NAND gate is opposite to the first signal, such that the second NAND gate controls the seventh MOSFET to be turned off; and in the second time period, the input signal of the second input terminal of the second NAND gate is opposite to the second signal, such that the second NAND gate controls the seventh MOSFET to be turned on.

With reference to the first aspect and the foregoing implementations of the first aspect, in another implementation of the first aspect, the at least one output branch is a plurality of output branches, and the status control branch includes: a seventh MOSFET, a second NAND gate and a third NAND gate; a source of the seventh MOSFET is grounded, a drain of the seventh MOSFET is the second terminal of the status control branch, a gate of the seventh MOSFET is connected to an output terminal of the second NAND gate, the output terminal of the second NAND gate is the first terminal of the status control branch, a first input terminal of the second NAND gate is connected to an output terminal of the third NAND gate, a plurality of input terminals of the third NAND gate are in a one-to-one correspondence with the plurality of output branches, and each input terminal of the third NAND gate is the third terminal of the status control branch and is connected to the third terminal of the delay control branch of each output branch; in the first time period, an input signal of a second input terminal of the second NAND gate is opposite to the first signal, such that the second NAND gate controls the seventh MOSFET to be turned off; and in the second time period, the input signal of the second input terminal of the second NAND gate is opposite to the second signal, such that the second NAND gate controls the seventh MOSFET to be turned on.

With reference to the first aspect and the foregoing implementations of the first aspect, in another implementation of the first aspect, the at least one output branch is a plurality of output branches, and a first output branch in the plurality of output branches includes a switching component, where the first terminal of the feedback branch is connected to a first terminal of the switching component, and a second terminal of the switching component is connected to a first terminal of a delay control branch of the first output branch; in the first time period, the switching component is turned on, and the feedback branch is configured to output the first voltage to the gate of the first MOSFET via the switching component; and when the switching component is turned off, the feedback branch is disconnected from the gate of the first MOSFET, such that the first MOSFET is turned off and the voltage output by the source of the first MOSFET is 0.

With reference to the first aspect and the foregoing implementations of the first aspect, in another implementation of the first aspect, in the second time period, the switching component is turned off.

With reference to the first aspect and the foregoing implementations of the first aspect, in another implementation of the first aspect, the switching component includes an eighth MOSFET and a ninth MOSFET; and a source of the eighth MOSFET is the first terminal of the switching component, a drain of the eighth MOSFET is connected to a drain of the ninth MOSFET, the drain of the ninth MOSFET is the second terminal of the switching component, a source of the ninth MOSFET is grounded, and a gate of the eighth MOSFET and a gate of the ninth MOSFET are configured to receive signals, such that the switching component is turned on or off.

With reference to the first aspect and the foregoing implementations of the first aspect, in another implementation of the first aspect, the eighth MOSFET is a P-type MOSFET, and the ninth MOSFET is an N-type MOSFET; or the eighth MOSFET is an N-type MOSFET, and the ninth MOSFET is a P-type MOSFET.

With reference to the first aspect and the foregoing implementations of the first aspect, in another implementation of the first aspect, a signal input to the gate of the eighth MOSFET is the same as a signal input to the gate of the ninth MOSFET.

With reference to the first aspect and the foregoing implementations of the first aspect, in another implementation of the first aspect, a voltage of the power supply is greater than the reference voltage, and the first voltage is greater than the reference voltage.

With reference to the first aspect and the foregoing implementations of the first aspect, in another implementation of the first aspect, the source of the first MOSFET is configured to provide the reference voltage to an analog-to-digital converter.

According to a second aspect, a reference voltage buffer circuit is provided, including: at least one output branch; and a feedback branch, including: a first operational amplifier, a current source, a third MOSFET, a fourth MOSFET, a fifth MOSFET and a status control branch, where a gate of the third MOSFET is connected to an output terminal of the first operational amplifier, is connected to a drain of the fifth MOSFET, and is connected to the at least one output branch; a source of the third MOSFET is connected to the current source and is connected to an inverting input terminal of the first operational amplifier; a drain of the third MOSFET and a drain of the fourth MOSFET are connected to a first terminal of the status control branch; a gate of the fourth MOSFET is connected to a second terminal of the status control branch; a source of the fourth MOSFET is connected to a power supply; and a source of the fifth MOSFET is grounded.

In a first time period, a gate of the fifth MOSFET is configured to receive a first signal such that the fifth MOSFET is turned off; the status control branch is configured to control, according to the first signal, the fourth MOSFET to be turned on, such that the drain of the third MOSFET is connected to the power supply via the fourth MOSFET; and the first operational amplifier is configured to control the gate of the third MOSFET to output a first voltage, such that the at least one output branch continuously outputs a reference voltage.

In a second time period after the first time period, the gate of the fifth MOSFET is configured to receive a second signal such that the fifth MOSFET is turned on, the output terminal of the first operational amplifier is turned off, and the third MOSFET is turned off, such that an output voltage of the at least one output branch is 0; and the status control branch is configured to control, according to the second signal, the drain of the fourth MOSFET and the drain of the third MOSFET to be grounded.

Therefore, according to the reference voltage buffer circuit in this embodiment of the present application, the status control branch is added between the third MOSFET and the fourth MOSFET, such that when the circuit is powered down, the third MOSFET and the fourth MOSFET are turned off; and at the same time, the status control branch may also control, according to the second signal, the drains of the fourth MOSFET and the third MOSFET to be grounded, so as to rapidly reduce the drain voltage, thereby reducing the overvoltage risk of the third MOS.

With reference to the second aspect, in an implementation of the second aspect, the first signal is a low-level signal, and the second signal is a high-level signal.

With reference to the second aspect and the foregoing implementations of the second aspect, in another implementation of the second aspect, each of the at least one output branch includes: a first MOSFET, a second MOSFET and a first inverter, where an input terminal of the first inverter and the gate of the third MOSFET are connected to a gate of the first MOSFET, an output terminal of the first inverter and a third terminal of the status control branch are connected to a gate of the second MOSFET, a source of the second MOSFET is connected to the power supply, and a drain of the second MOSFET is connected to a drain of the first MOSFET.

With reference to the second aspect and the foregoing implementations of the second aspect, in another implementation of the second aspect, each output branch further includes a resistor and a capacitor, where the gate of the third MOSFET is connected to a first terminal of the resistor; a second terminal of the resistor, the gate of the first MOSFET and the input terminal of the first inverter are connected to a first terminal of the capacitor; and a second terminal of the capacitor is grounded.

With reference to the second aspect and the foregoing implementations of the second aspect, in another implementation of the second aspect, each output branch further includes a load resistor, where a first terminal of the load resistor is grounded, and a second terminal of the load resistor is connected to the source of the first MOSFET.

With reference to the second aspect and the foregoing implementations of the second aspect, in another implementation of the second aspect, the at least one output branch is one output branch, and the status control branch includes: a seventh MOSFET, a second NAND gate and a second inverter; a source of the seventh MOSFET is grounded, a drain of the seventh MOSFET is the first terminal of the status control branch, an output terminal of the second NAND gate is connected to a gate of the seventh MOSFET and is the second terminal of the status control branch, a first input terminal of the second NAND gate is connected to an output terminal of the second inverter, and an input terminal of the second inverter is the third terminal of the status control branch; in the first time period, an input signal of a second input terminal of the second NAND gate is opposite to the first signal, such that the second NAND gate controls the seventh MOSFET to be turned off; and in the second time period, the input signal of the second input terminal of the second NAND gate is opposite to the second signal, such that the second NAND gate controls the seventh MOSFET to be turned on.

With reference to the second aspect and the foregoing implementations of the second aspect, in another implementation of the second aspect, the at least one output branch is a plurality of output branches, and the status control branch includes: a seventh MOSFET, a second NAND gate and a third NAND gate; and a source of the seventh MOSFET is grounded, a drain of the seventh MOSFET is the first terminal of the status control branch, an output terminal of the second NAND gate is connected to a gate of the seventh MOSFET and is the second terminal of the status control branch, a first input terminal of the second NAND gate is connected to an output terminal of the third NAND gate, a plurality of input terminals of the third NAND gate are in a one-to-one correspondence with the plurality of output branches, and each input terminal of the third NAND gate is the third terminal of the status control branch and is connected to the gate of the second MOSFET and the output terminal of the first inverter of each output branch. In the first time period, an input signal of a second input terminal of the second NAND gate is opposite to the first signal, such that the second NAND gate controls the seventh MOSFET to be turned off; and in the second time period, the input signal of the second input terminal of the second NAND gate is opposite to the second signal, such that the second NAND gate controls the seventh MOSFET to be turned on.

With reference to the second aspect and the foregoing implementations of the second aspect, in another implementation of the second aspect, the at least one output branch is a plurality of output branches, and a first output branch in the plurality of output branches includes a switching component, where a first terminal of the switching component is connected to the gate of the third MOSFET, and a second terminal of the switching component is connected to the gate of the first MOSFET of the first output branch, and is connected to the input terminal of the first inverter of the first output branch; in the first time period, the switching component is turned on, and the gate of the third MOSFET is configured to output the first voltage to the gate of the first MOSFET via the switching component; and when the switching component is turned off, the gate of the third MOSFET is disconnected from the gate of the first MOSFET, such that the first MOSFET is turned off and the voltage output by the source of the first MOSFET is 0.

With reference to the second aspect and the foregoing implementations of the second aspect, in the second time period, the switching component is turned off.

With reference to the second aspect and the foregoing implementations of the second aspect, in another implementation of the second aspect, the switching component includes an eighth MOSFET and a ninth MOSFET; and a source of the eighth MOSFET is the first terminal of the switching component, a drain of the eighth MOSFET is connected to a drain of the ninth MOSFET, the drain of the ninth MOSFET is the second terminal of the switching component, a source of the ninth MOSFET is grounded, and a gate of the eighth MOSFET and a gate of the ninth MOSFET are configured to receive signals, such that the switching component is turned on or off.

With reference to the second aspect and the foregoing implementations of the second aspect, in another implementation of the second aspect, the eighth MOSFET is a P-type MOSFET, and the ninth MOSFET is an N-type MOSFET; or the eighth MOSFET is an N-type MOSFET, and the ninth MOSFET is a P-type MOSFET.

With reference to the second aspect and the foregoing implementations of the second aspect, in another implementation of the second aspect, a signal input to the gate of the eighth MOSFET is the same as a signal input to the gate of the ninth MOSFET.

With reference to the second aspect and the foregoing implementations of the second aspect, in another implementation of the second aspect, the feedback branch further includes a voltage limiting branch, a first terminal of the voltage limiting branch is connected to the gate of the third MOSFET, and a second terminal of the voltage limiting branch is connected to the source of the third MOSFET; and the voltage limiting branch is configured to limit a gate voltage of the third MOSFET in the first time period according to a source voltage of the third MOSFET.

With reference to the second aspect and the foregoing implementations of the second aspect, in another implementation of the second aspect, the voltage limiting branch includes a second operational amplifier and a sixth MOSFET, where an inverting input terminal of the second operational amplifier is connected to an output terminal of the second operational amplifier and is connected to a drain of the sixth MOSFET, a source of the sixth MOSFET is the first terminal of the voltage limiting branch, and a gate of the sixth MOSFET is the second terminal of the voltage limiting branch; in the first time period, if the sixth MOSFET is turned on, the second operational amplifier is configured to limit the gate voltage of the third MOSFET; and in the second time period, the output terminal of the second operational amplifier is turned off.

With reference to the second aspect and the foregoing implementations of the second aspect, in another implementation of the second aspect, an input voltage of a non-inverting input terminal of the second operational amplifier is equal to the reference voltage.

With reference to the second aspect and the foregoing implementations of the second aspect, in another implementation of the second aspect, an input voltage of a non-inverting input terminal of the first operational amplifier is equal to the reference voltage.

With reference to the second aspect and the foregoing implementations of the second aspect, in another implementation of the second aspect, a voltage of the power supply is greater than the reference voltage, and the first voltage is greater than the reference voltage.

With reference to the second aspect and the foregoing implementations of the second aspect, in another implementation of the second aspect, the at least one output branch is configured to provide the reference voltage to at least one analog-to-digital converter.

According to a third aspect, a reference voltage buffer circuit is provided, including: a plurality of output branches, where a first output branch in the plurality of output branches includes a switching component and an output component; and a feedback branch, where a first terminal of the feedback branch is connected to a first terminal of the switching component, a second terminal of the switching component is connected to a first terminal of the output component, a second terminal of the output component is connected to a power supply, and a second terminal of the feedback branch is connected to the power supply; and when the switching component is turned on, the first terminal of the feedback branch is configured to output a first voltage to the output component via the switching component, so that a third terminal of the output component continuously outputs a reference voltage according to the first voltage; and when the switching component is turned off, the first terminal of the feedback branch is disconnected from the output component, so that a voltage output by a third terminal of the output component is 0.

Therefore, the switching component can be set for each output branch in the reference voltage buffer circuit, so as to control the on and off of each output branch. For example, the reference voltage buffer circuit may be controlled such that some of the branches are connected to provide reference voltages for the corresponding ADCs, and the others are disconnected to reduce power consumption.

With reference to the third aspect, in an implementation of the third aspect, the switching component includes an eighth MOSFET and a ninth MOSFET; and a source of the eighth MOSFET is the first terminal of the switching component, a drain of the eighth MOSFET is connected to a drain of the ninth MOSFET, the drain of the ninth MOSFET is the second terminal of the switching component, a source of the ninth MOSFET is grounded, and a gate of the eighth MOSFET and a gate of the ninth MOSFET are configured to receive signals, such that the switching component is turned on or off.

With reference to the third aspect and the foregoing implementations of the third aspect, in another implementation of the third aspect, the eighth MOSFET is a P-type MOSFET, and the ninth MOSFET is an N-type MOSFET; or the eighth MOSFET is an N-type MOSFET, and the ninth MOSFET is a P-type MOSFET.

With reference to the third aspect and the foregoing implementations of the third aspect, in another implementation of the third aspect, a signal input to the gate of the eighth MOSFET is the same as a signal input to the gate of the ninth MOSFET.

With reference to the third aspect and the foregoing implementations of the third aspect, in another implementation of the third aspect, the output component includes: a first MOSFET, a second MOSFET and a first inverter, where an input terminal of the first inverter is connected to a gate of the first MOSFET and is the first terminal of the output component, an output terminal of the first inverter is connected to a gate of the second MOSFET, a source of the second MOSFET is the second terminal of the output component, a drain of the second MOSFET is connected to a drain of the first MOSFET, and a source of the first MOSFET is the third terminal of the output component.

With reference to the third aspect and the foregoing implementations of the third aspect, in another implementation of the third aspect, the output component further includes a resistor and a capacitor, where a first terminal of the resistor is the first terminal of the output component; a second terminal of the resistor, the gate of the first MOSFET and the input terminal of the first inverter are connected to a first terminal of the capacitor; and a second terminal of the capacitor is grounded.

With reference to the third aspect and the foregoing implementations of the third aspect, in another implementation of the third aspect, each output branch further includes a load resistor, where a first terminal of the load resistor is grounded, and a second terminal of the load resistor is connected to the source of the first MOSFET.

With reference to the third aspect and the foregoing implementations of the third aspect, in another implementation of the third aspect, the feedback branch includes a first operational amplifier, a current source, a third MOSFET, a fourth MOSFET and a fifth MOSFET, where a gate of the third MOSFET is connected to an output terminal of the first operational amplifier, is connected to a drain of the fifth MOSFET, and is a first terminal of the feedback branch; a source of the third MOSFET is connected to the current source and is connected to an inverting input terminal of the first operational amplifier; a drain of the third MOSFET is connected to a drain of the fourth MOSFET; a gate of the fourth MOSFET, the output terminal of the first inverter and the gate of the second MOSFET are connected; a source of the fourth MOSFET is connected to the power supply; and a source of the fifth MOSFET is grounded.

In the first time period, the switching component is turned on, a gate of the fifth MOSFET is configured to receive a first signal such that the fifth MOSFET is turned off, and the first operational amplifier is configured to control the gate of the third MOSFET to output the first voltage; and in a second time period after the first time period, the gate of the fifth MOSFET is configured to receive a second signal such that the fifth MOSFET is turned on, the output terminal of the first operational amplifier is turned off, and the third MOSFET is turned off.

With reference to the third aspect and the foregoing implementations of the third aspect, in another implementation of the third aspect, the first signal is a low-level signal, and the second signal is a high-level signal.

With reference to the third aspect and the foregoing implementations of the third aspect, in another implementation of the third aspect, the feedback branch further includes a voltage limiting branch, a first terminal of the voltage limiting branch is connected to the gate of the third MOSFET, and a second terminal of the voltage limiting branch is connected to the source of the third MOSFET; and the voltage limiting branch is configured to limit a gate voltage of the third MOSFET in the first time period according to a source voltage of the third MOSFET.

With reference to the third aspect and the foregoing implementations of the third aspect, in another implementation of the third aspect, the voltage limiting branch includes a second operational amplifier and a sixth MOSFET, where an inverting input terminal of the second operational amplifier is connected to an output terminal of the second operational amplifier and is connected to a drain of the sixth MOSFET, a source of the sixth MOSFET is the first terminal of the voltage limiting branch, and a gate of the sixth MOSFET is the second terminal of the voltage limiting branch; in the first time period, if the sixth MOSFET is turned on, the second operational amplifier is configured to limit the gate voltage of the third MOSFET; and in the second time period, the output terminal of the second operational amplifier is turned off.

With reference to the third aspect and the foregoing implementations of the third aspect, in another implementation of the third aspect, an input voltage of a non-inverting input terminal of the second operational amplifier is equal to the reference voltage.

With reference to the third aspect and the foregoing implementations of the third aspect, in another implementation of the third aspect, an input voltage of a non-inverting input terminal of the first operational amplifier is equal to the reference voltage.

With reference to the third aspect and the foregoing implementations of the third aspect, in another implementation of the third aspect, a voltage of the power supply is greater than the reference voltage, and the first voltage is greater than the reference voltage.

With reference to the third aspect and the foregoing implementations of the third aspect, in another implementation of the third aspect, the third terminal of the output component is configured to provide the reference voltage to an analog-to-digital converter.

DESCRIPTION OF EMBODIMENTS

The technical solutions in the embodiments of the present application will be described below in conjunction with the accompanying drawings.

Figure 1:
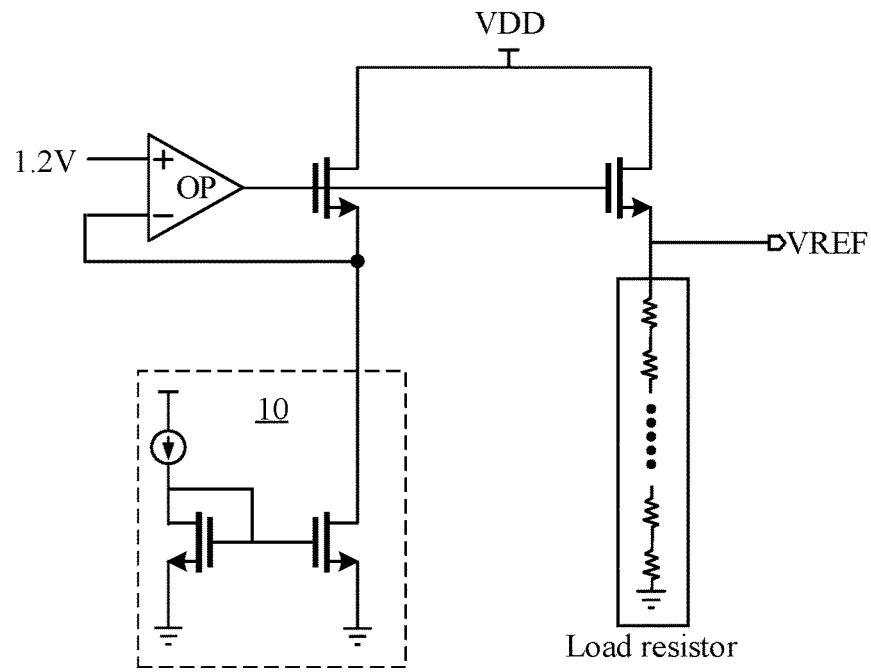
FIG. 1 is a schematic diagram of a conventional reference voltage buffer circuit.

FIG. 1 shows a circuit diagram of a conventional reference voltage buffer (RVB). As shown in FIG. 1, the circuit includes an operational amplifier OP on the left, and an output terminal of the operational amplifier is connected to gates of two MOSFETs. The operational amplifier OP and the left MOSFET form a feedback branch, which can clamp an output voltage VREF of a source of the right MOSFET, and the output voltage can be used as a reference voltage of an ADC. For example, the two MOSFETs in FIG. 1 are both N-type MOSFETs. As shown in FIG. 1, the circuit further includes a current source 10 for supplying a current to the circuit. For example, the current source may be shown in FIG. 1, including two MOSFETs, for example, including two N-type MOSFETs, but this embodiment of the present application is not limited thereto. Optionally, as shown in FIG. 1, the circuit may further include a load resistor, an output branch formed by the load resistor and an output power MOSFET can maintain the output reference voltage, and the output voltage VREF is equal to a product of a load resistance and a current through the load resistor. The resistance value of the load resistor is determined by the requirements of the ADC for an output impedance of the reference voltage. For example, the output impedance is positively correlated with the resistance value of the load resistor.

In the circuit shown in FIG. 1, the output voltage VREF needs to be slightly lower than a power supply voltage VDD, such that the output power MOSFET (namely, the MOSFET on the right in FIG. 1) works in a saturation region, that is, satisfying (VDD−VREF)>Vdsat, where Vdsat denotes an overdrive voltage of the right MOSFET. For example, in the conventional RVB design shown in FIG. 1, the power supply voltage may be set to 2.5V that is greater than 1.2V to obtain a 1.2V ADC reference voltage. In addition, the device type of the MOSFET needs to be a thick gate device. For example, a 5V device is required, that is, a MOSFET with a withstand voltage of 5V is selected to meet the reliability requirements. Compared with the 1.2V device, the 5V device is slower, has a larger on-resistance, and has a lower energy efficiency. The use of the 5V device as the power MOS will greatly increase the area and power consumption of the RVB circuit design.

Figure 2:
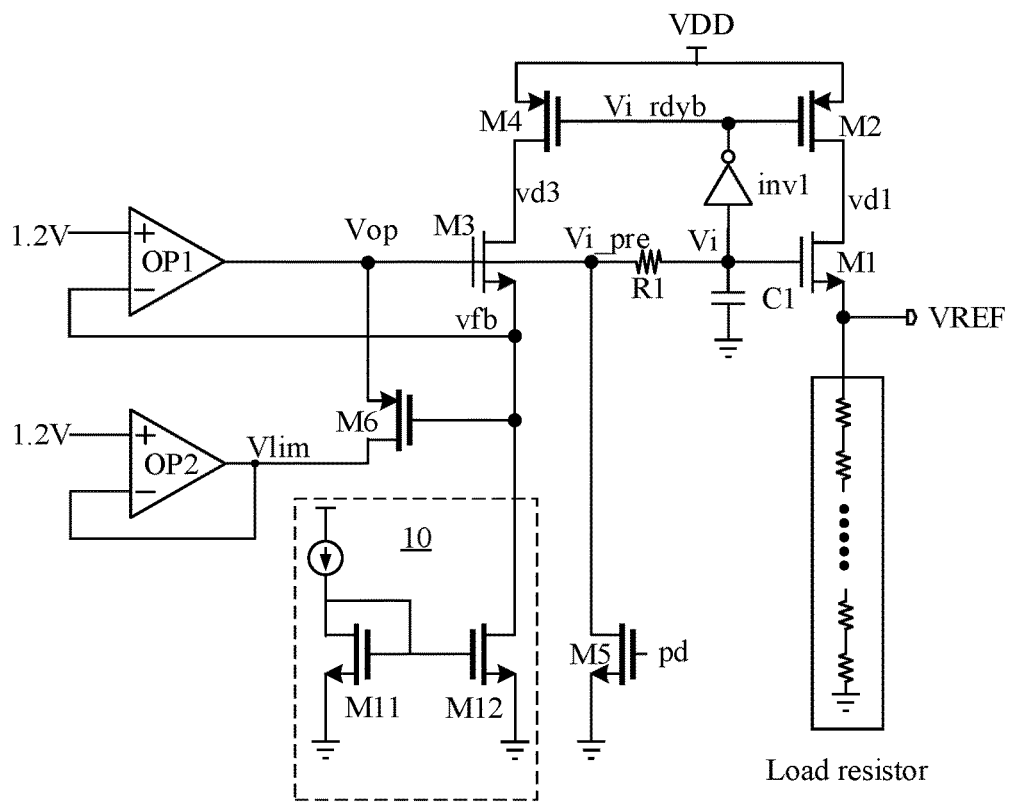
FIG. 2 is a schematic diagram of a reference voltage buffer circuit improved based on FIG. 1; and FIG. 3 to FIG. 12 is schematic diagrams of reference voltage buffer circuits according to embodiments of the present application.

FIG. 2 shows a RVB design circuit improved based on FIG. 1. Similar to FIG. 1, FIG. 2 may include a current source 10 and a load resistor. For brevity, details are not repeated herein. In order to improve the energy efficiency of the RVB circuit and reduce the area of the power MOS, the design may use a 1.2V N-type MOSFET as an output power transistor, namely, a MOSFET M1 in FIG. 2. In addition, a MOSFET M3 in FIG. 2 is also a 1.2V N-type MOSFET, and the rest of the circuit composition uses 5V MOSFETs (shown in bold in FIG. 2). Moreover, an auxiliary circuit is added to solve the reliability problem of a 1.2V MOSFET in a 2.5V voltage domain.

Specifically, a working status of the RVB circuit shown in FIG. 2 may be divided into two phases: an initial precharge phase and an output establishment phase. First, in the initial precharge phase, the circuit is powered down (pd), output terminals of two operational amplifiers OP1 and OP2 are turned off, that is, an output voltage is 0, and the RVB circuit inputs a pd signal to control a MOSFET 5 (for ease of description, a MOSFET is denoted as "M" below, for example, the MOSFET 5 is denoted as "M5", and so on) to be turned on. For example, the input pd signal shown in FIG. 2 may be a high-level signal, that is, a high level is input to a gate of M5, which can control the N-type M5 to be turned on, so that a voltage Vi_pre of a gate of M3 is pulled to a ground voltage gnd, that is, Vi_pre=0, and gate voltages of M3 and M1 are 0. After passing through an inverter inv1, gate voltages of P-type M4 and M2 are high level, and then M1–M4 are all turned off. In this case, the output voltage VREF of the circuit is 0. That is, a voltage output by a feedback branch composed of the operational amplifier OP1, M3 and M4 is 0, and an output voltage of an output branch composed of M1, M2 and the inverter inv1 is also 0.

Then, the pd signal of the circuit is released. For example, a low-level signal is input to the gate of M5, so M5 is turned off, and output terminals of the operational amplifiers OP1 and OP2 are opened. A voltage vfb at a gate terminal of the P-type M6 is 0, that is, M6 is turned on, and the operational amplifier OP2 outputs Vlim through feedback. For example, obtaining the output voltage VREF of 1.2V is still taken as an example in FIG. 2, in this case, an input voltage for a non-inverting input terminal of the operational amplifier OP2 may be set to 1.2V, and therefore the output voltage Vlim is 1.2V. In addition, because M6 is turned on, the outputs of the operational amplifiers OP1 and OP2 are short-circuited, and an output voltage of the operational amplifier OP1 is equal to an output voltage of the operational amplifier OP2, that is, Vop in FIG. 2 is also equal to 1.2V, which can control a gate voltage of M3 to be 1.2V. In this case, gate terminal node voltages Vi_pre and Vi of M3 and M1 are pulled up slowly through the operational amplifier OP2 and OP1, and the voltages are limited to around 1.2V through the feedback of the OP2, so as to avoid overvoltage of the 1.2V M3 and M1 devices.

In the output establishment phase, Vi is generated by a Vi_pre signal passing through a resistor-capacitor RC filter circuit composed of a resistor $R_1$ and a capacitor $C_1$. The RC filter circuit can filter out most of front-end circuit noise, and M4 and M2 are turned on slowly, to avoid a large transient current and voltage glitches caused by too fast turning-on. In the process in which the gate voltage Vi of M1 is charged slowly to near 1.2V, a voltage Vi_rdyb output by the inverter inv1 designed with an inverted ratio (an inversion threshold Vth is set to be near 1.2V and slightly lower than 1.2 V) is slowly discharged from the previous high level to gnd, that is, M4 and M2 gradually enter the conductive state, and then a drain voltage of M3 and a drain voltage of M1 are both pulled to a power supply voltage. For example, if the power supply voltage herein is 2.5V, and a source voltage vfb of M3 and the output voltage VREF both become (Vi_pre−Vgs3), M6 is turned off, where Vgs3 is a voltage difference between the gate and the source of M3, that is, the gate voltage of M3 minus the source voltage is equal to Vgs3, and Vgs3 for M3 in FIG. 2 is equal to a voltage difference Vgs1 between the gate and the source of M1. For example, the current and size of M3 and that of M1 may be set in equal proportions such that the gate-source voltage differences Vgs3 and Vgs1 for the two are equal. After M6 is turned off, the voltage Vop is no longer limited by the operational amplifier OP2, and the feedback branch composed of the operational amplifier OP1, M3, and M4 continues to charge Vi_pre until the voltage Vi_pre reaches 1.2V+Vgs3. Accordingly, the voltage Vfb and the output voltage VREF may be clamped near 1.2V, that is, the RVB circuit can continuously output the 1.2V reference voltage VREF to the ADC.

The inverter inv1 shown in FIG. 2 may be an inverter designed with an inverted ratio to reduce an inversion speed of the inverter. Specifically, the larger the width-to-length ratios of a PMOS and an NMOS in the inverter, the stronger the MOS driving capability, and the faster the inversion speed of the inverter; conversely, the smaller the width-to-length ratios, the weaker the MOS driving capability, and the slower the inversion speed. In conventional circuits, the width-to-length ratio is usually set to be greater than 1, to obtain a fast circuit speed. However, in the embodiments of this application, to reduce the inversion speed of the inverter such that M2 and M4 are slowly turned on, the inverter is designed as an unconventional inverter with an inverted ratio. That is, the width-to-length ratios of the PMOS and the NMOS in the inverter inv1 in FIG. 2 are less than 1, to reduce the inversion speed of the inverter.

It should be understood that the above-mentioned two phases of the circuit shown in FIG. 2 are alternated in cycles. For example, after the initial precharge phase, there is the output establishment phase; and after the output establishment phase, there can be another initial precharge phase, and so on. The phases occur alternately.

Through the operations in the above two phases, during the establishment of the circuit, the maximum of |Vgd| for 1.2V M3 and M1 is max {Vth, VDD−Vth}, where Vgd denotes a voltage difference between the gate and the drain, and |Vgs| outputs the maximum Vth, where VDD=2.5V, Vth (namely, the inversion threshold of the inverter inv1) is designed to be near 1.2V and less than 1.2V. In addition, before the drains of M3 and M1 are connected to VDD (2.5V), drain-source channels of M3 and M1 are already turned on, thereby solving the overvoltage risk of the 1.2V output power transistor.

However, in FIG. 2, according to the above description, the voltage Vi_rdyb is pulled up after the pd signal is released. Therefore, when the circuit is enabled and then powered down, that is, when the circuit is powered down after the above-mentioned output establishment phase, M3 and M1 are turned off before M4 and M2, respectively. A node vd3 between the drain of M3 and the drain of M4 and a node vd1 between the drain of M1 and the drain of M2 have no discharge channel after the circuit is powered down, and will stay near 2.5V for a long time, that is, Vgd of 1.2V M3 and M1 will stay near 2.5V for a long time, which may cause gate breakdown of the component. In addition, in the design of FIG. 2, the output voltage Vi_rdyb of the inverter inv1 is used to control to turn on M4 and M2. When a design that a plurality of output branches multiplexing the same feedback branch is used, an output branch cannot be closed alone, which increases the power consumption of the RVB design. Therefore, the reference voltage buffer circuit provided in the embodiments of the present application can solve the above-mentioned problem.

Figure 3:
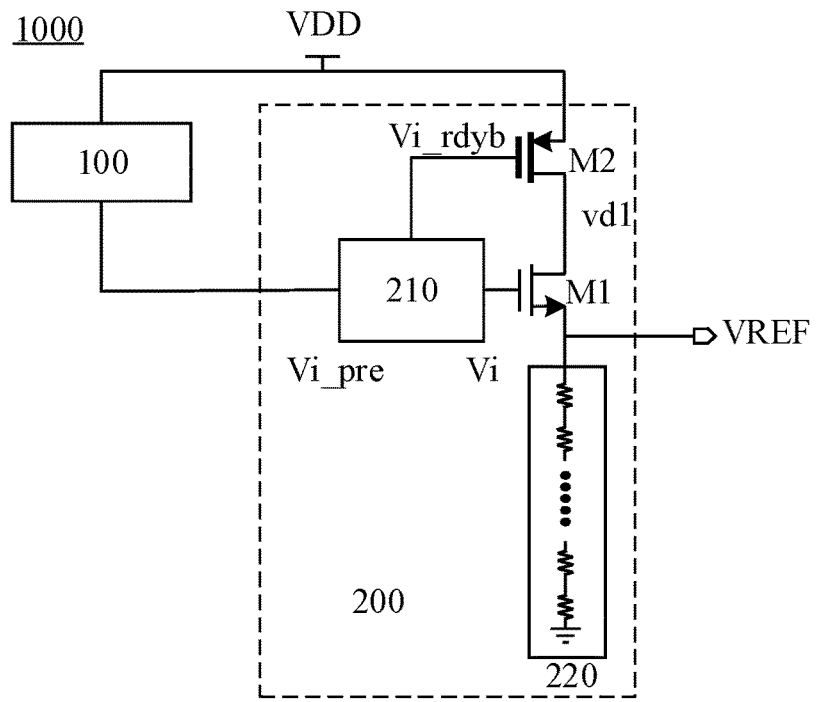

Optionally, as a first embodiment of the present application, FIG. 3 shows a schematic diagram of a reference voltage buffer circuit 1000 according to an embodiment of the present application. As shown in FIG. 3, the reference voltage buffer circuit 1000 may be configured to provide a reference voltage for an ADC. The reference voltage buffer circuit 1000 may include: a feedback branch 100 and at least one output branch 200, where the reference voltage buffer circuit 1000 may include one or more output branches 200, and each output branch 200 is configured to provide a reference voltage for a corresponding ADC. Any one of the output branches 200 is taken as an example for description below in conjunction with FIG. 3.

As shown in FIG. 3, each output branch 200 in this embodiment of the present application may include a delay control branch 210, a first MOSFET M1, and a second MOSFET M2. Specifically, the connection manners of various parts of the output branch 200 and the feedback branch 100 are shown in FIG. 3, where a first terminal of the feedback branch 100 is connected to a first terminal of the delay control branch 210, a second terminal of the feedback branch 100 is connected to a power supply, and a voltage of the power supply is VDD; and a second terminal of the delay control branch 210 is connected to a gate of M1, a third terminal of the delay control branch 210 is connected to a gate of M2, a source of M2 is connected to the power supply, and a drain of the M2 is connected to a drain of the M1. Optionally, in this embodiment of the present application, M1 being an N-type MOSFET and M2 being a P-type MOSFET are taken as an example for description.

According to the connection manner described above, for the reference voltage buffer circuit 1000 shown in FIG. 3, in a first time period, the first terminal of the feedback branch 100 is configured to output a first voltage to the delay control branch 210 of each output branch 200, that is, a node voltage Vi_pre connected to the first terminal of the feedback branch 100 is the first voltage; and the delay control branch 210 is configured to control, based on the first voltage, both M1 and M2 to be turned on, such that a gate voltage of M1 is also the first voltage, and a source of M1 can continuously output a reference voltage VREF, where the first voltage may be determined according to the required reference voltage VREF, and at the same time, the first voltage also determines the magnitude of the reference voltage VREF. For example, according to the magnitude of the reference voltage VREF required by the ADC connected to the reference voltage buffer circuit 1000, the first voltage is reasonably selected and set, such that the source of M1 can output the reference voltage VREF required by the ADC, where the first voltage minus Vgs1 is equal to the reference voltage VREF, and Vgs1 is a voltage difference between the gate and the source of M1.

In a second time period after the first time period, a voltage output by the first terminal of the feedback branch 100 to the delay control branch 210 of each output branch 200 is 0, that is, a node voltage Vi_pre connected to the first terminal of the feedback branch 100 is 0, such that the delay control branch 210 can control M1 to be turned off, and a output voltage output by the source of the first MOSFET is 0; in addition, the delay control branch 210 is further configured to control the second MOSFET to be turned off before the first MOSFET is turned off.

Optionally, the reference voltage buffer circuit 1000 may further include other components. For example, each output branch 200 may further include a load resistor 220. The load resistor 220 may correspond to the load resistor in FIG. 2, and the functions of the two are the same. For brevity, details are not repeated herein.

Therefore, according to the reference voltage buffer circuit 1000 in this embodiment of the present application, compared with the output branch in the reference voltage buffer circuit shown in FIG. 2, the inverter inv1 in FIG. 2 is replaced with the delay control branch 210, such that when the circuit is powered down, and the node voltage Vi_pre connected to the feedback branch drops to a low level, the delay control branch 210 can control the M2 to be turned off before the M1, that is, after the circuit is powered down, a node vd1 between the drain of M1 and the drain of the M2 has a discharge channel, such as a discharge channel formed by the M1 and the load resistor 220, then vd1 can be quickly reduced to 0, thereby reducing the overvoltage risk of the M1. For example, the reference voltage VREF of 1.2V is still taken as an example. Referring to FIG. 2, in order to reduce the area of the MOSFET and maintain the high-speed and high-reliability reference voltage buffer circuit 1000, the M1 is still a 1.2V device, the M2 is a 5V device, and the power supply voltage VDD is 2.5V. In this case, the delay control branch 210 can make the M2 be turned off first, a source voltage of the M1 can slowly drop to 0, and discharging can be performed through the source grounding, to slowly reduce a drain voltage of the M1, and further reduce the overvoltage risk of the M1.

Figure 4:
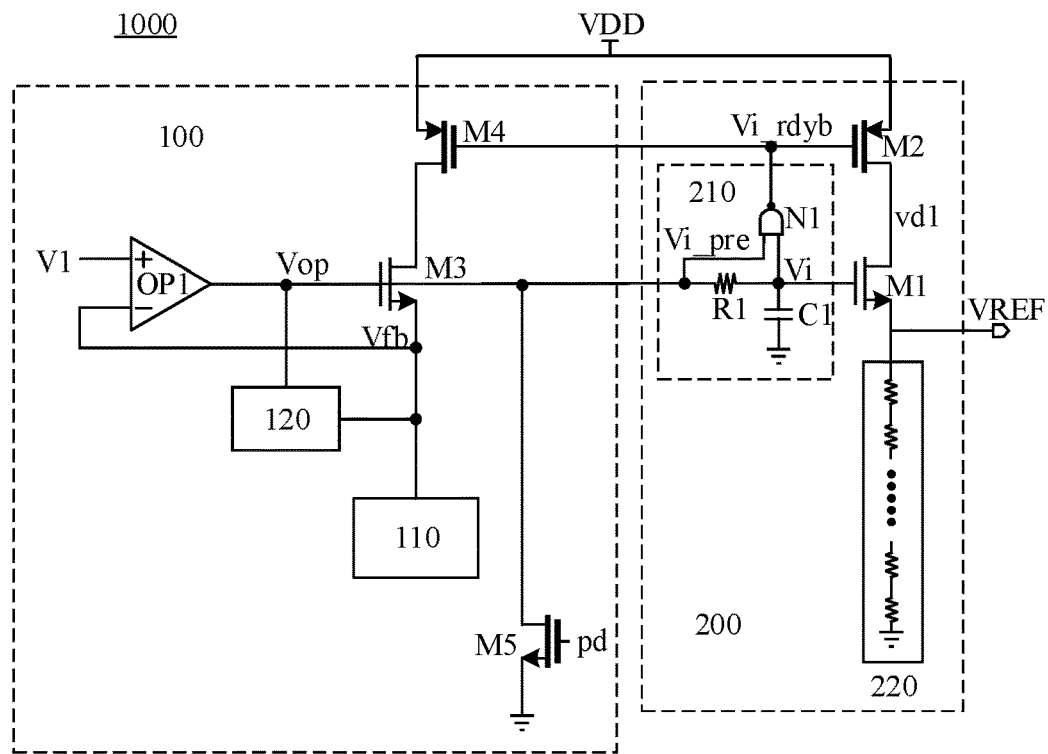

Optionally, FIG. 4 is another schematic diagram of the reference voltage buffer circuit 1000 of FIG. 3. As shown in FIG. 4, the delay control branch 210 in this embodiment of the present application may include a first NAND gate N1 and a delay component, where a first input terminal of the first NAND gate N1 is a first terminal of the delay control branch 210, that is, connected to the feedback branch 100; a second input terminal of the first NAND gate N1 is a second terminal of the delay control branch 210, that is, connected to the gate of M1; an output terminal of the first NAND gate N1 is a third terminal of the delay control branch 210, that is, connected to the gate of M2; and the delay component is disposed between the first input terminal of the first NAND gate N1 and the second input terminal of the first NAND gate N1, and the delay component makes M1 turned off after M2 is turned off.

Optionally, similar to FIG. 2, as shown in FIG. 4, the delay component included in the delay control branch 210 corresponding to each output branch 200 in FIG. 3 may include an RC filter circuit. Specifically, as shown in FIG. 4, a specific connection manner of the RC filter circuit may be shown in FIG. 4. The RC filter circuit includes a resistor R1 and a capacitor C1. The first terminal of the feedback branch 100 is connected to a first terminal of the resistor R1. A second terminal of the resistor R1, the gate of M1, the second input terminal of the first NAND gate N1 and a first terminal of the capacitor C1 are connected, and a second terminal of the capacitor C1 is grounded. In this way, due to the effect of the RC filter circuit, the voltage Vi will slowly drop to a low level after the voltage Vi_pre drops to a low level. However, due to the function of the first NAND gate N1, M2 can be turned off when the voltage Vi_pre drops to a low level, that is, M2 is turned off before M1, to avoid overvoltage of M1.

The feedback branch 100 in this embodiment of the present application will be described below in conjunction with FIG. 4. As shown in FIG. 4, the feedback branch 100 may include a first operational amplifier OP1, a current source 110, a third MOSFET M3, a fourth MOSFET M4, and a fifth MOSFET M5. A specific connection manner may be as shown in FIG. 4. For example, a gate of M3 is connected to a drain of M5, is connected to an output terminal of the first operational amplifier OP1, and is the first terminal of the feedback branch 100; a source of M3 is connected to the current source 110 and is connected to an inverting input terminal of the first operational amplifier OP1, where the current source 110 is configured to provide a current for the reference voltage buffer circuit 1000; a drain of the M3 is connected to a drain of the M4, a gate of the M4 and the output terminal of the first NAND gate N1 are connected to the gate of the M2, a source of the M4 is connected to the power supply VDD, and a source of the M5 is grounded.

Specifically, in the first time period, the gate of the M5 is configured to receive a first signal, that is, a pd signal in FIG. 4 is the first signal, to turn off the M5, and the first operational amplifier OP1 is configured to control the gate of the M3 to output the first voltage, so that the gate of the M3 outputs the first voltage to each output branch 200. For example, the M5 may be an N-type MOSFET, and the received first signal may be a low-level signal, such that the M5 is turned off. A non-inverting input terminal of the first operational amplifier OP1 may be provided with an input voltage V1, such that the first operational amplifier OP1 can control the gate of the M3 to output the first voltage. For example, referring to the embodiment shown in FIG. 2, if the output voltage VREF of the source of M1 is desired to be 1.2V, the input voltage V1 may be 1.2V, but this embodiment of the present application is not limited thereto.

In the second time period after the first time period, the gate of M5 is configured to receive a second signal, that is, the pd signal in FIG. 4 is the second signal, such that the M5 is turned on, that is, the gate of M3 is grounded, M3 is turned off. At the same time, the output terminal of the first operational amplifier OP is turned off, in this case, the voltage output from the feedback branch 100 to each output branch 200 is 0. For example, the M5 may be an N-type MOSFET, and the second signal may be a high-level signal, such that the M5 is turned off.

Optionally, as shown in FIG. 4, the feedback branch 100 may further include a voltage limiting branch 120, where a first terminal of the voltage limiting branch 120 is connected to the gate of the M3, a second terminal of the voltage limiting branch 120 is connected to the source of the M3, and the voltage limiting branch 120 may be configured to output a voltage Vop according to the source voltage of the M3 during the first time period, to limit the gate voltage of the M3 and prevent the gate voltage of the M3 from being too large.

Figure 5:
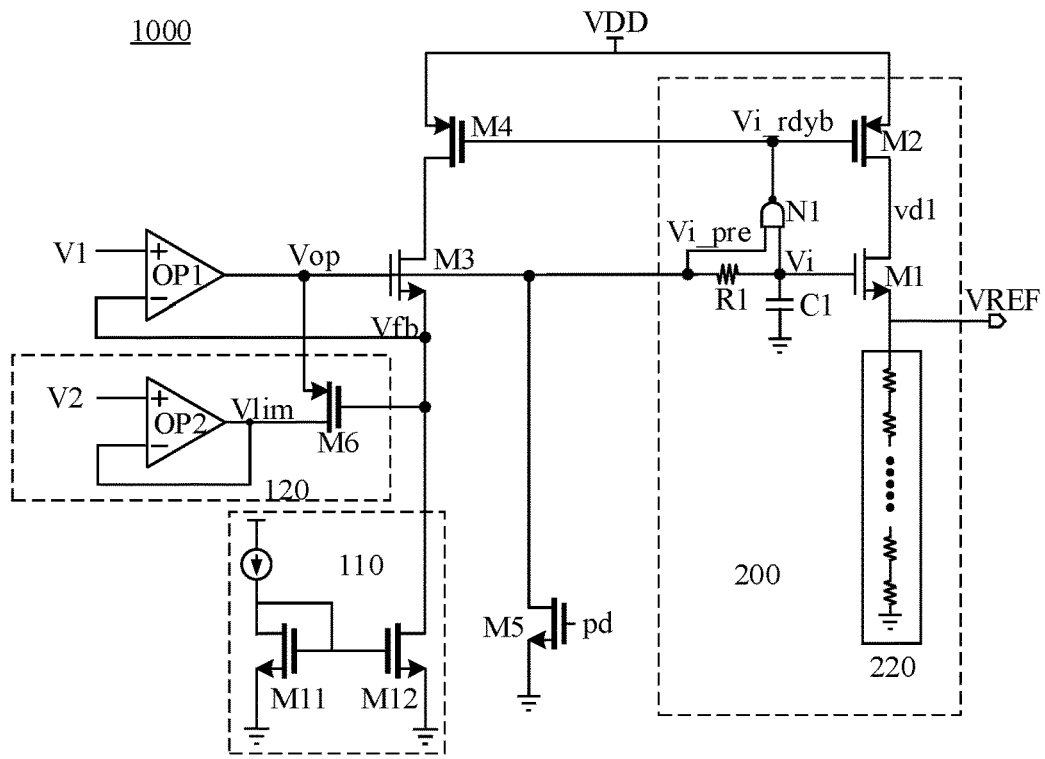

It should be understood that the first operational amplifier OP1, M3, M4, M5, the voltage limiting branch 120 and the current source 110 in this embodiment of the present application may refer to the circuit shown in FIG. 1 or FIG. 2. Specifically, FIG. 5 is another schematic diagram of a reference voltage buffer circuit 1000 according to an embodiment of the present application. As shown in FIG. 5, the current source 110 in this embodiment of the present application may include M11 and M12, and the current source may correspond to the current source 10 shown in FIG. 2. For brevity, details are not repeated herein.

In addition, as shown in FIG. 5, the voltage limiting branch 120 in this embodiment of the present application may refer to FIG. 2, and the voltage limiting branch may include the second operational amplifier OP2 and a sixth MOSFET M6. A specific connection manner may be as shown in FIG. 5. An inverting input terminal of the second operational amplifier OP2 is connected to an output terminal of the second operational amplifier OP2 and is connected to a drain of M6. A source of M6 is connected to the output terminal of the first operational amplifier OP1 and the gate of the M3. A gate of the M6 is connected to the source of the M3 and a non-inverting input terminal of the first operational amplifier OP1.

It should be understood that the second operational amplifier OP2 and the M6 included in the voltage limiting branch 120 shown in FIG. 5 may be the second operational amplifier OP2 and the M6 as shown in FIG. 2, and for brevity, details are not repeated herein. For example, an input voltage V2 for the non-inverting input terminal of the second operational amplifier OP2 may be set equal to the reference voltage VREF, for example, both are equal to 1.2V, such that the second operational amplifier OP2 outputs the voltage Vop to the gate of M3 when the M6 is turned on, to limit the gate voltage of M3 to be equal to the reference voltage VREF.

It should be understood that, comparing FIG. 5 and FIG. 2 can be seen, a difference between the two is that the inverter inv1 in FIG. 2 is replaced with the first NAND gate N1 in FIG. 5, so that the first NAND gate N1 is used to control the M2 to be turned off before the M1. Therefore, the above description of the working status of other components in FIG. 2 is applicable to FIG. 5, and for brevity, details are not repeated herein.

It should be understood that the first time period in this embodiment of the present application may be in the above-mentioned output establishment phase, or in a phase after the output establishment phase, in which the reference voltage buffer circuit can continuously output the reference voltage. In other words, the first time period may be the phase after the output establishment phase, in which the reference voltage buffer circuit can continuously output the reference voltage, and also any time period before the circuit is powered down again; and the second time period is a phase after the output establishment phase, in which the circuit is powered down again.

From the comparison between FIG. 2 and FIG. 5, when the inverter inv1 shown in FIG. 2 is used, in the second time period, the M1 and the M2 are almost turned off at the same time, and the node vd1 between the two has no discharge channel, causing the voltage difference Vgd1 between the gate and the drain of the M1 to be under the power supply voltage VDD for a long time. For example, if the M1 is turned off, the gate voltage of the M1 is 0, and the drain voltage is 2.5V, then Vgd1 of the M1 with a withstand voltage of 1.2V is under the voltage of 2.5V for a long time, and thus there is a risk of device overvoltage. However, for the circuit using the first NAND gate N1 as shown in FIG. 5, when the output voltage of the feedback branch 100 is 0, that is, the node voltage Vi_pre connected to the gate of M3 is quickly pulled to the ground, the output inversion (from 0 to VDD) speed of the first NAND gate N1 is determined by Vi_pre, that is, the output Vi_rdyb of the first NAND gate N1 can be quickly inverted from 0 to VDD, and then the M2 is quickly turned off. However, because Vi is obtained from Vi_pre through RC filtering, the former Vi has a delay relative to the latter Vi_pre. That is, when the M2 is turned off, Vi is slowly discharged to 0, and the M1 is slowly turned off after the M2 is turned off. Using this delay difference, a discharge channel (including the M1 and the load resistor) for the node vd1 can be constructed, and the voltage of node vd1 is discharged to a safe voltage and then M1 is turned off, thereby addressing the risk of device overvoltage of the output power transistor M1 when the circuit is powered down or the output branch is turned off.

The reference voltage buffer circuit 1000 described above can solve the possible overvoltage problem of the M1 in FIG. 2, and the following will describe the possible overvoltage problem of the M3 in FIG. 2.

Figure 6:
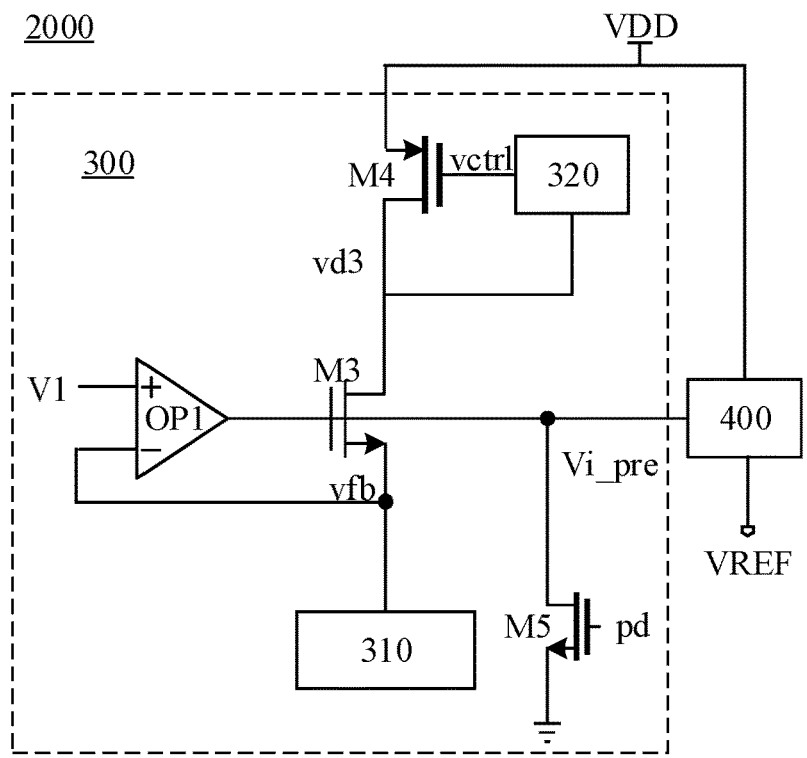

Optionally, as a second embodiment of the present application, FIG. 6 is a schematic diagram of a reference voltage buffer circuit 2000 according to an embodiment of the present application. As shown in FIG. 6, the reference voltage buffer circuit 2000 includes a feedback circuit 300 and at least one output branch 400, where the reference voltage buffer circuit 2000 may include one or more output branches 400. Any one of the output branches 400 is taken as an example for description below in conjunction with FIG. 6.

As shown in FIG. 6, the feedback branch 300 includes: a first operational amplifier OP1, a current source 310, a third MOSFET M3, a fourth MOSFET M4, a fifth MOSFET M5, and a status control branch 320. Specifically, a connection manner of the output branch 400 and the feedback branch 300 is shown in FIG. 6, where a gate of the M3 is connected to an output terminal of the first operational amplifier OP1, is connected to a drain of the M5, and is connected to the at least one output branch 400; a source of the M3 is connected to the current source 310, and is connected to an inverting input terminal of the first operational amplifier OP1; a drain of the M3 and a drain of the M4 are connected to a first terminal of the status control branch 320; a gate of the M4 is connected to a second terminal of the status control branch 320, a source of the M4 is connected to a power supply, a voltage of the power supply is VDD, the at least one output branch 400 is connected to the power supply, and a source of M5 is grounded. Optionally, in this embodiment of the present application, M3 and M5 being N-type MOSFETs and M4 being a P-type MOSFET are taken as an example for description.

According to the connection manner described above, for the reference voltage buffer circuit 2000 shown in FIG. 6, in a first time, a gate of the M5 is configured to receive a first signal, that is, a pd signal in FIG. 6 is the first signal, such that the M5 is turned off, for example, the M5 may be an N-type MOSFET, and the first signal may be a low-level signal to turn off the M5; and the status control branch 320 is configured to control, according to the first signal, the M4 to be turned on, such that the drain of the M3 is connected to the power supply via the M4, and the first operational amplifier OP1 is configured to control the gate of the M3 to output a first voltage, so that the at least one output branch 400 continuously outputs a reference voltage. A non-inverting input terminal of the first operational amplifier OP1 may be provided with an input voltage V1, such that the first operational amplifier OP1 can control the gate of the M3 to output the first voltage. For example, referring to the embodiment shown in FIG. 2, if the output voltage VREF of the source of M1 is desired to be 1.2V, the input voltage V1 may be 1.2V, but this embodiment of the present application is not limited thereto.

In a second time after the first time, the gate of the M5 is configured to receive a second signal, that is, the pd signal in FIG. 6 is the second signal, to turn on the M5, that is, the gate of the M3 is grounded, to turn off the M3, for example, the M5 may be an N-type MOSFET, and the second signal may be a high-level signal to turn on the M5; in addition, the output terminal of the first operational amplifier OP1 is turned off, and the M3 is turned off, such that an output voltage of the at least one output branch 400 is 0, and the status control branch 320 is configured to control, according to the second signal, the drain of the M4 and the drain of the M3 to be grounded.

Therefore, compared with the output branch in the reference voltage buffer circuit shown in FIG. 2, the reference voltage buffer circuit 2000 in this embodiment of the present application adds the status control branch 320 between the M3 and the M4 in FIG. 2, such that when the circuit is powered down, the operational amplifier OP1 turns off the output according to the second signal, and the M5 is turned on and grounded, such that the output voltage of the gate of the M3 is 0 and the M3 is turned off. At the same time, the status control branch 320 can also control, according to the second signal, the M4 to be turned off and a node vd3 between the drain of the M3 and the drain of the M4 to be grounded. In this way, when the M3 and the M4 are turned off almost at the same time, the drain of the M3 and the drain of the M4 can be both grounded, so that after the circuit is powered down, the node vd3 between the two can be reduced to 0 more quickly, thereby reducing the overvoltage risk of the M3.

It should be understood that the first signal and the second signal in this embodiment of the present application are different signals. For example, for the circuit shown in FIG. 6, the first signal is a low-level signal and the second signal is a high-level signal; conversely, for other circuit designs, the first signal may also be a high-level signal, and the second signal may be a low-level signal. The embodiments of the present application are not limited thereto.

Figure 7:
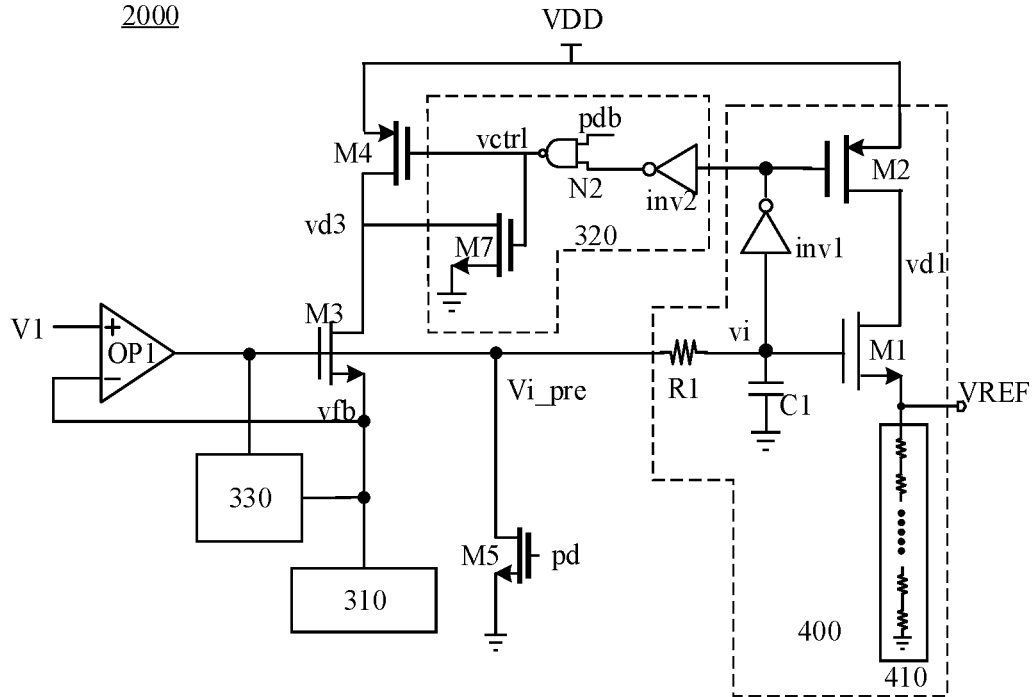

The branches included in the reference voltage buffer circuit 2000 in FIG. 6 will be described in detail below in conjunction with the accompanying drawings. FIG. 7 is another schematic diagram of the reference voltage buffer circuit 2000 shown in FIG. 6. As shown in FIG. 7, similar to FIG. 2, each output branch 400 in FIG. 7 may include all or part of a first MOSFET M1, a second MOSFET M2, a first inverter inv1, a load resistor 410, and an RC filter circuit. Functions thereof are the same as those in FIG. 2. For brevity, details are not repeated herein. For example, as shown in FIG. 7, an input terminal of the first inverter is connected to a gate of the M1, an output terminal of the first inverter inv1, a third terminal of the status control branch 320, and a gate of the M2 are connected, a source of the M2 is connected to the power supply, and a drain of the M2 is connected to a drain of the M1.

For another example, as shown in FIG. 7, each output branch 400 further includes a resistor R1 and a capacitor C1, a gate of the M3 is connected to a first terminal of the resistor R1, a second terminal of the resistor R1, the gate of the M1, an input terminal of the first inverter inv1 and a first terminal of the capacitor C1 are connected, and a second terminal of the capacitor C1 is grounded.

Optionally, the status control branch 320 in this embodiment of the present application may be implemented in a plurality of manners, and the embodiments of the present application are not limited thereto. For example, as shown in FIG. 7, if the at least one output branch 400 is one output branch, the status control branch 320 may include: a seventh MOSFET M7, a second NAND gate N2 and a second inverter inv2. Specifically, as shown in FIG. 7, a source of the M7 is grounded, a drain of the M7, the drain of the M3 and the drain of the M4 are connected, a gate of the M7 is connected to an output terminal of the second NAND gate N2, a first input terminal of the second NAND gate N2 is connected to an output terminal of the second inverter inv2, and an input terminal of the second inverter inv2, the output terminal of the first inverter inv1 and the gate of the M2 are connected.

In the first time period, an input signal of a second input terminal of the second NAND gate N2 is opposite to the first signal, that is, a pdb signal of the second input terminal of the second NAND gate N2 is a signal opposite to the first signal, such that the second NAND gate N2 controls the M7 to be turned off. For example, as shown in FIG. 7, the first signal may be a low level, the pdb signal of the second input terminal of the second NAND gate N2 is a high level, and the output terminal of the second inverter inv2 will also output a high level as the gate voltage of the M3 increases. In this case, the second NAND gate N2 outputs a low level, and the N-type MOSFET M7 is turned off.

In the second time period, the input signal of the second input terminal of the second NAND gate N2 is opposite to the second signal, that is, the pdb signal of the second input terminal of the second NAND gate N2 is a signal opposite to the second signal, such that the second NAND gate N2 controls the M7 to be turned on. For example, as shown in FIG. 7, the second signal may be a high level, and the M5 is turned on after receiving the second signal, so that the gate of the M3 is grounded, to control the M3 to be turned off; at the same time, the pdb signal of the second input terminal of the second NAND gate N2 is a low level, the output terminal of the second NAND gate N2 outputs a high level to turn on the M7, the M4 is turned off, and the drains of the M3 and the M4 are grounded, so that a voltage for the node vd3 between the M3 and the M4 can be reduced to 0, thereby preventing M3 from overvoltage.

Optionally, if the at least one output branch 400 in this embodiment of the present application is a plurality of output branches, the second inverter inv2 shown in FIG. 7 may be replaced with a third NAND gate N3. An output terminal of the third NAND gate N3 corresponds to the output terminal of the original second inverter inv2, and is still connected to the first input terminal of the second NAND gate N2, while input terminals of the third NAND gate N3 are connected to the plurality of output branches 400 in a one-to-one correspondence, where for any input terminal of the third NAND gate N3, the input terminal of it and an output terminal of a first inverter inv1 included in a corresponding output branch are connected to the gate of M2. In this way, the function of the third NAND gate N3 is similar to that of the second inverter inv2, and for brevity, details are not repeated herein.

Figure 8:
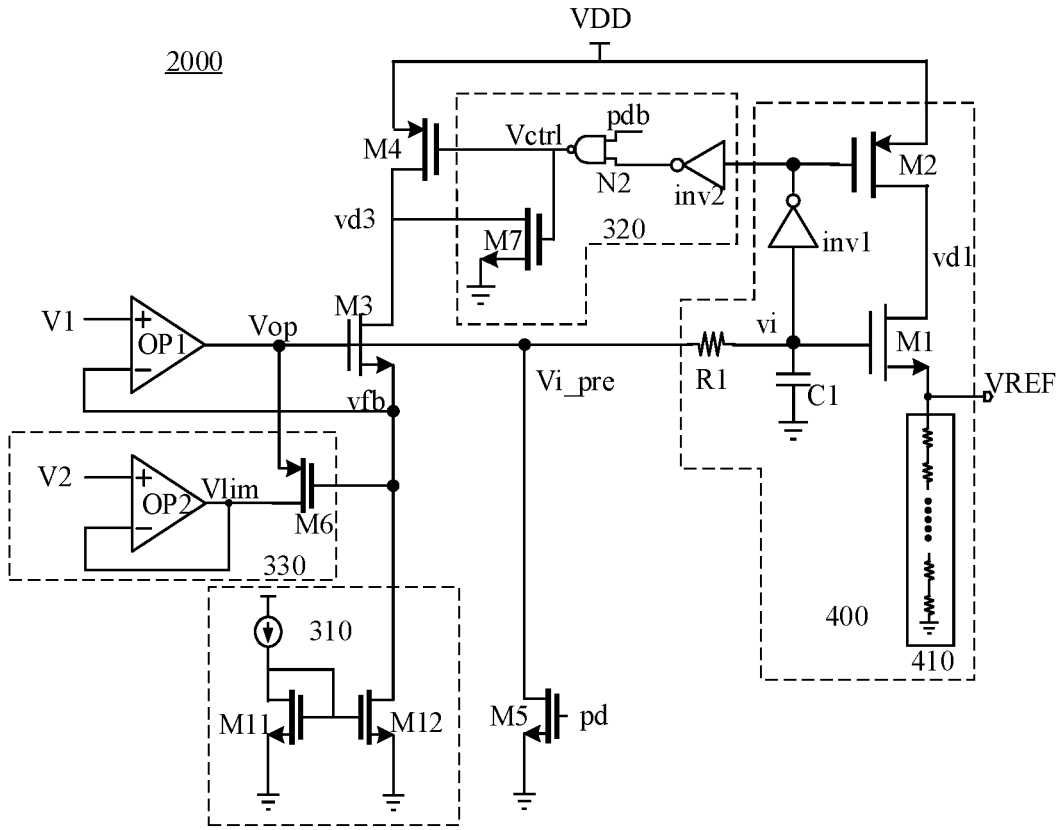

Other parts of the feedback branch 300 in this embodiment of the present application will be described below in conjunction with the accompanying drawings. FIG. 8 is another schematic diagram of a reference voltage buffer circuit 2000 according to an embodiment of the present application. As shown in FIG. 8, which is similar to FIG. 4 and FIG. 5, the current source 320 in this embodiment of the present application may correspond to the current source 110 in FIG. 4 and FIG. 5. For brevity, details are not repeated herein. As shown in FIG. 8, the pd signal of the M5 is opposite to the input signal, namely the pdb signal, of the second input terminal of the second NAND gate N2.

In addition, the comparison between FIG. 8 and FIG. 2 shows that a difference between the two is that FIG. 8 adds the status control branch 320 between the output terminal of the inverter inv1 and the gate of the M2 in FIG. 2. Therefore, the above description of other working states in FIG. 2 is applicable to FIG. 8, and for brevity, details are not repeated herein.

It should be understood that the first time period and the second time period involved in the reference voltage buffer circuit 2000 in this embodiment of the present application are consistent with those of the reference voltage buffer circuit 1000. To be specific, the first time period involved in the reference voltage buffer circuit 2000 may also be after the above-mentioned output establishment phase and before powering down again, while the second time period is a phase in which the circuit is powered down again after the output establishment phase.

From the comparison between FIG. 2 and FIG. 8, when the circuit shown in FIG. 2 is used, after the M3 and the M4 are turned off, the node vd3 between the two has no discharge channel, causing the voltage difference Vgd3 between the gate and the drain of the M3 to be under the power supply voltage VDD for a long time. For example, if Vgd3 of the 1.2V M3 is under the voltage of 2.5V for a long time, there is a risk of device overvoltage. However, the circuit of FIG. 8 adds the status control branch 320 to the feedback branch. For example, the status control branch 320 may include M7 and a two-input second NAND gate N2 to provide the node vd3 with a discharge channel when the RVB circuit is powered down. When the entire RVB circuit is powered down, the pd signal received by the M5 turns on the M5. For example, the pd signal may be a high-level signal, so that the gate node voltage Vi_pre of the M3 is pulled to gnd. At the same time, one input terminal of the second NAND gate N2 receives the pdb signal, which is opposite to the pd signal, that is, the one input terminal of the second NAND gate N2 receives a low-level signal, so that the output Vctrl of the second NAND gate N2 is a high-level signal, the M7 pulls the drain node voltage vd3 of the M3 to gnd, and the feedback branch is turned off, thereby avoiding the overvoltage risk of the M3.

Figure 9:
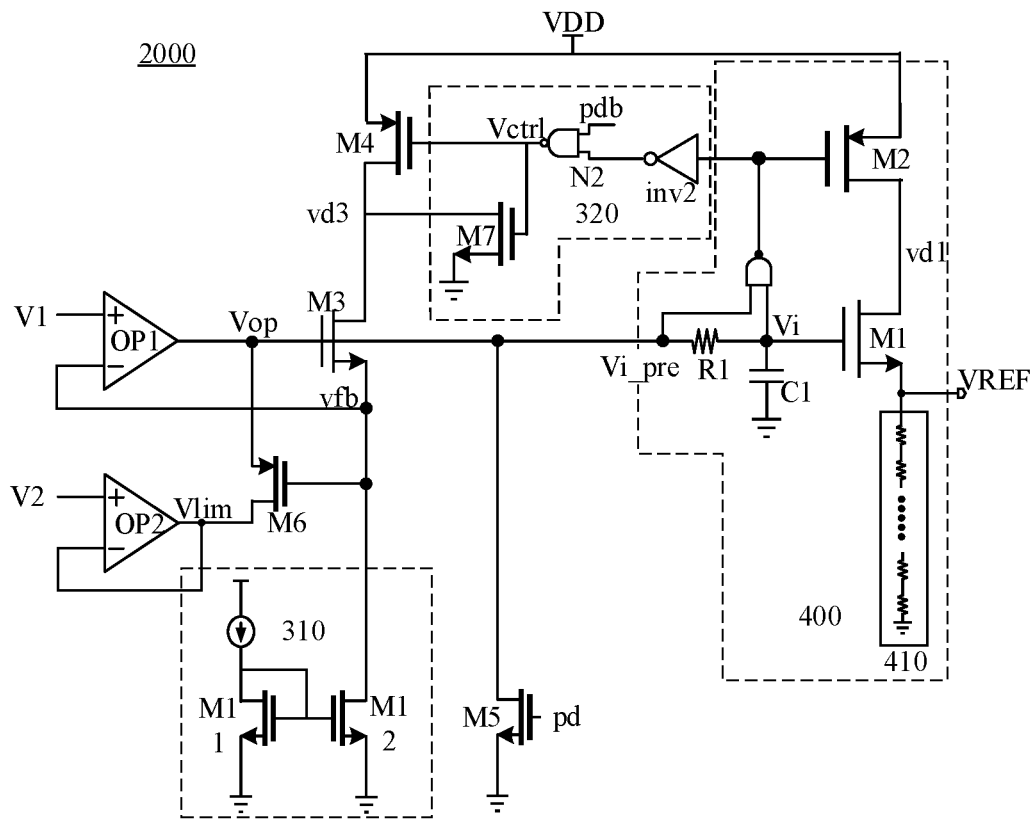

It should be understood that the two embodiments described above may be used alone or in combination. For example, FIG. 9 is another schematic diagram of a reference voltage buffer circuit 2000 according to an embodiment of the present application. The reference voltage buffer circuit 2000 is a combination of FIG. 5 and FIG. 8, and is applied to the related description of FIG. 5 and FIG. 8. For brevity, details are not repeated herein.

The foregoing two embodiments are mainly described by using an example in which the reference voltage buffer circuit includes one output branch. The following description will focus on the case where the reference voltage buffer circuit includes a plurality of output branches.

Figure 10:
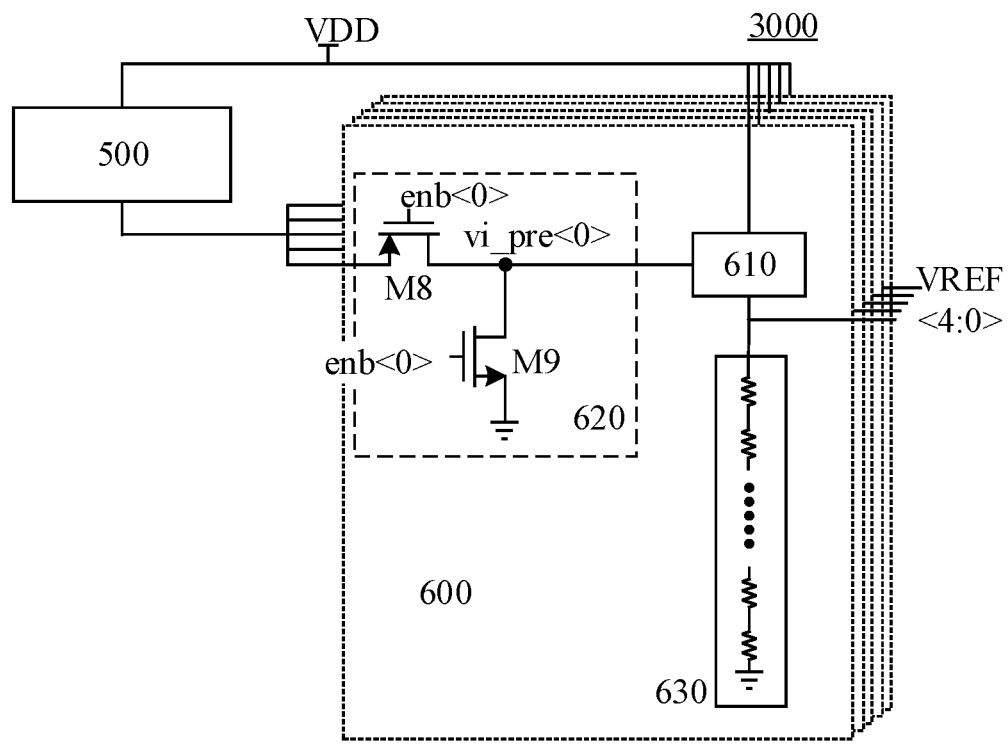

Optionally, as a third embodiment of the present application, FIG. 10 is a schematic diagram of a reference voltage buffer circuit 3000 according to an embodiment of the present application. As shown in FIG. 10, the reference voltage buffer circuit 3000 includes a feedback circuit 500 and a plurality of output branches 600. In FIG. 10, as an example, the reference voltage buffer circuit 3000 includes five output branches 600, and correspondingly there are five output voltages, which may be expressed as VREF<0> to VREF<4>, respectively. In other words, VREF<4:0> in FIG. 9 includes VREF<0> to VREF<4>.

As shown in FIG. 10, for ease of description, any one of the plurality of output branches is taken as an example below for description, that is, a first output branch 600 is taken as an example. For example, the first output branch may be the first branch in FIG. 10. The first output branch 600 includes an output component 610 and a switching component 620, where a first terminal of the feedback branch 500 is connected to a first terminal of the switching component 620, and a second terminal of the switching component 620 is connected to a first terminal of the output component 610, a second terminal of the output component 610 is connected to a power supply, and a second terminal of the feedback branch 500 is also connected to the power supply, where the power supply voltage is VDD.

When the switching component 620 is turned on, the first terminal of the feedback branch 500 is configured to output a first voltage to the output component 610 via the switching component 620, so that a third terminal of the output component 610 continuously outputs a reference voltage according to the first voltage. When the switching component 620 is turned off, the feedback branch 500 is disconnected from the first output branch 600, that is, a voltage output by the output component 610 is 0.

Therefore, the switching component 620 can be set for each output branch in the reference voltage buffer circuit 3000, so as to control the on and off of each output branch. For example, the reference voltage buffer circuit 3000 may be controlled such that some of the branches are connected, and the others are disconnected. The connected branches can provide reference voltages for the corresponding ADCs, to reduce power consumption.

Optionally, the switching component 620 may be implemented by using various circuits, and the embodiments of the present application are not limited thereto. For example, as shown in FIG. 10, the switching component 620 may include an eighth MOSFET M8 and a ninth MOSFET M9. As shown in FIG. 10, a source of the M8 is connected to a first terminal of the feedback branch 500, a drain of the M8 is connected to a drain of the M9, the drain of the M9 is connected to a first terminal of the output component 610, a source of the M9 is grounded, and a gate of the M8 and a gate of the M9 are configured to receive signals, such that the switching component 620 is turned on or off. For example, different states of the switching component 620 may be implemented by setting the on and off states of the M8 and the M9 to be always different. When M8 is turned on and M9 is turned off, the switching component 620 is turned on; conversely, when M8 is turned off and M9 is turned on, the switching component 620 is turned off.

Optionally, the M8 and the M9 may be set to different types or to the same type. For example, the M8 and the M9 are set to different types. As shown in FIG. 10, the M8 may be a P-type MOSFET and the M9 may be an N-type MOSFET; or different from FIG. 10, the M8 is an N-type MOSFET, and the M9 is a P-type MOSFET. In this way, the M8 and the M9 can be controlled by using the same input signal. That is, a signal enb<0> input to the gate of the M8 is the same as a signal enb<0> input to the gate of the M9, and the on and off states of the M8 and the M9 are always different.

It should be understood that with reference to the foregoing description, the feedback branch 500 in this embodiment of the present application may be the feedback branch 100 in the foregoing reference voltage buffer circuit 1000, or may be the feedback branch 300 in the foregoing reference voltage buffer circuit 2000; and except for the switching component 620, the remaining part of the output branch 600 may be the output branch 200 in the foregoing reference voltage buffer circuit 1000, or may be the output branch 400 in the foregoing reference voltage buffer circuit 2000. For brevity, details are not repeated herein.

Figure 11:
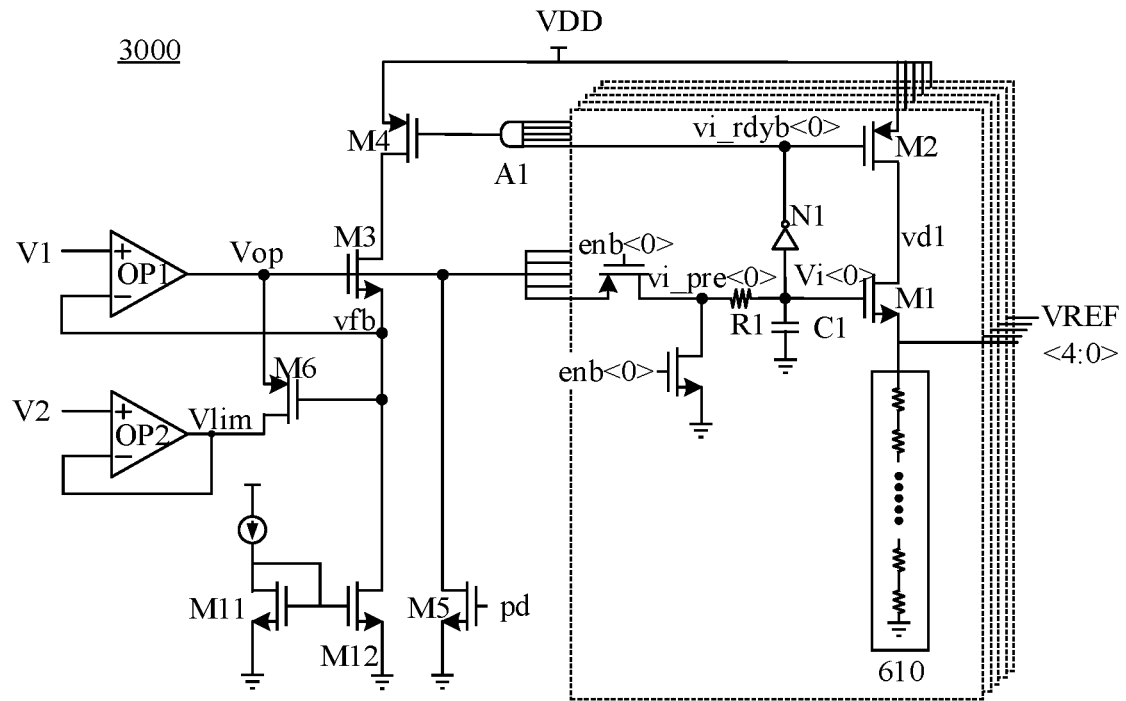

For example, FIG. 11 is another schematic diagram of a reference voltage buffer circuit 3000 according to an embodiment of the present application. As shown in FIG. 11, a connection manner of various components is shown in FIG. 11. In addition, the reference voltage buffer circuit 3000 is a schematic diagram of the feedback branch 100 in the foregoing reference voltage buffer circuit 1000 in combination with the output branch 400 in the reference voltage buffer circuit 2000, and the related description applies. For example, the load resistor 610 corresponds to the load resistor 410. For brevity, details are not repeated herein. A gate of M4 and a gate of M2 of each output branch 600 may be connected via an AND gate A1, that is, an input terminal of the AND gate A1 is connected to the gate of each M2, and an output terminal of the AND gate A1 is connected to the gate of the M4, to achieve the corresponding objectives of controlling the M2 and the M4.

Figure 12:
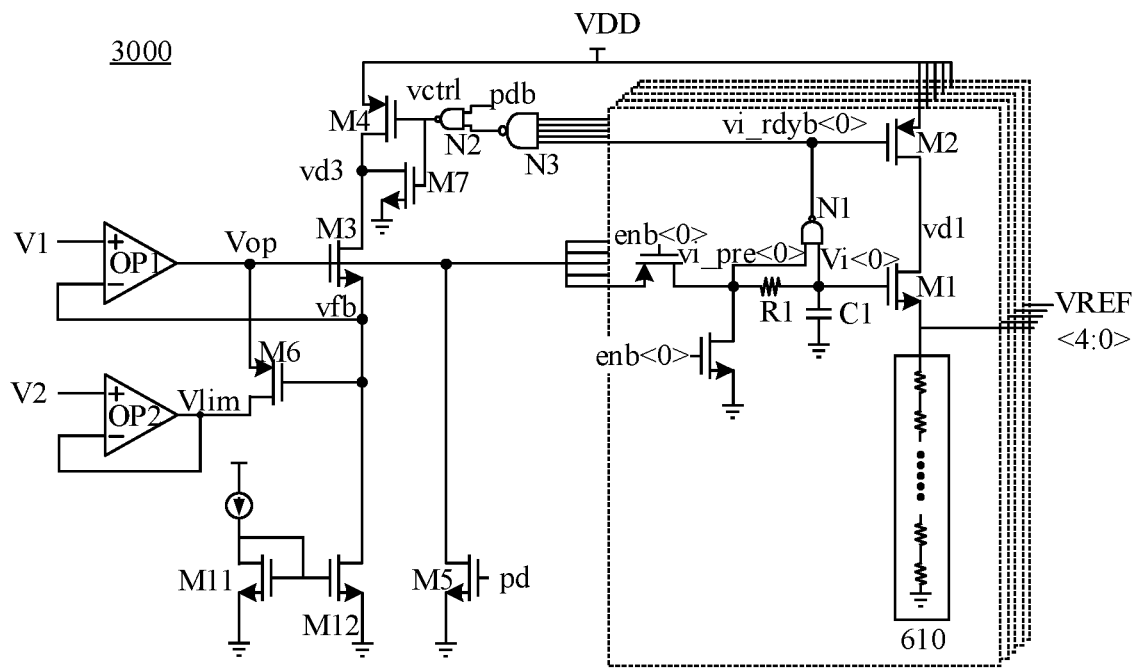

It should be understood that the foregoing three embodiments may be used alone or in combination with each other. For example, the three embodiments shown in the foregoing reference voltage buffer circuits 1000 to 3000 may be used in combination with each other. Specifically, FIG. 12 is another schematic diagram of a reference voltage buffer circuit 3000 according to an embodiment of the present application. As shown in FIG. 12, a connection manner of various components is shown in FIG. 12. In addition, the reference voltage buffer circuit 3000 may be a combination of the reference voltage buffer circuit 1000 shown in FIG. 5, the reference voltage buffer circuit 2000 shown in FIG. 8, and the reference voltage buffer circuit 3000 shown in FIG. 10, and the related description applies to each part. For brevity, details are not repeated herein.

Therefore, for the reference voltage buffer circuit 3000 shown in FIG. 12, a discharge channel design of the feedback branch is added to address the overvoltage risk of the M3 device when the circuit shown in FIG. 2 is powered down; a design that the plurality of output branches multiplexing the same feedback branch design is used, and the M8 and the M9 add a function of separately turning off different output branches, to reduce unnecessary power consumption. In addition, by using a delay difference of the RC filter circuit, the NAND gate N1 addresses the overvoltage risk of the M1 device that may exist when the output of a particular branch is closed.

It should be understood that in the embodiments of the present application, the same reference numeral denotes the same component, and for brevity, the detailed description of the same component is omitted in different embodiments.

Persons of ordinary skill in the art may be aware that, in combination with the examples described in the embodiments disclosed in this specification, units and algorithm steps may be implemented by using electronic hardware or a combination of computer software and electronic hardware. Whether the functions are performed by hardware or software depends on particular applications and design constraint conditions of the technical solutions. Persons skilled in the art may use different methods to implement the described functions for each particular application, but it should not be considered that the implementation goes beyond the scope of the present application.

Persons skilled in the art can clearly understand that for convenience and brevity of description, reference may be made to the corresponding processes in the foregoing method embodiments for specific working processes of the system, apparatus, and units described above. Details are not described herein again.

In several embodiments provided in the present application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be omitted or not performed. In addition, the displayed or discussed mutual couplings or direct couplings or communication connections may be implemented by using some interfaces. The indirect couplings or communication connections between the apparatuses or units may be implemented in electrical, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, function units in the embodiments of the present application may be integrated into one processing unit, or each of the units may exist alone physically, or two or more units are integrated into one unit.

If the function is implemented in the form of software function units and sold or used as independent products, the function may be stored in a computer readable storage medium. Based on such an understanding, the technical solutions of the present application essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of the present application. The storage medium described above includes various media, such as a USB flash drive, a removable hard disk, a read-only memory (ROM), a random access memory (RAM), a magnetic disk, or an optical disc, that can store program code.

The foregoing descriptions are merely specific implementations of the present application, but the protection scope of the present application is not limited thereto. Any variation or replacement readily figured out by persons skilled in the art within the technical scope disclosed in the present application shall fall within the protection scope of the present application. Therefore, the protection scope of the present application shall be subject to the protection scope of the claims.

What is claimed is:

1. A reference voltage buffer circuit, comprising:
at least one output branch, wherein each of the at least one output branch comprises a delay control branch, a first MOSFET and a second MOSFET; and
a feedback branch,
wherein a first terminal of the feedback branch is connected to a first terminal of the delay control branch, a second terminal of the feedback branch is connected to a power supply, a second terminal of the delay control branch is connected to a gate of the first MOSFET, a third terminal of the delay control branch is connected to a gate of the second MOSFET, a source of the second MOSFET is connected to the power supply, and a drain of the second MOSFET is connected to a drain of the first MOSFET;
in a first time period, the first terminal of the feedback branch is configured to output a first voltage to the delay control branch, and the delay control branch is configured to control, on the basis of the first voltage, the first MOSFET and the second MOSFET to be turned on, such that a source of the first MOSFET continuously outputs a reference voltage; and
in a second time period after the first time period, a voltage output from the first terminal of the feedback branch to the delay control branch is 0, the delay control branch is configured to control the first MOSFET to be turned off, and to control the second MOSFET to be turned off before the first MOSFET is turned off, and a voltage output by the source of the first MOSFET is 0.

2. The reference voltage buffer circuit according to claim 1, wherein the delay control branch comprises a first NAND gate and a delay component, wherein
a first input terminal of the first NAND gate is the first terminal of the delay control branch, a second input terminal of the first NAND gate is the second terminal of the delay control branch, an output terminal of the first NAND gate is the third terminal of the delay control branch, and the delay component is disposed between the first input terminal of the first NAND gate and the second input terminal of the first NAND gate.

3. The reference voltage buffer circuit according to claim 2, wherein the delay component comprises a resistor and a capacitor, the resistor is disposed between the first input terminal of the first NAND gate and the second input terminal of the first NAND gate, a first terminal of the capacitor is connected to the second input terminal of the first NAND gate, and a second terminal of the capacitor is grounded.

4. The reference voltage buffer circuit according to claim 2, wherein each output branch further comprises a load resistor, wherein
a first terminal of the load resistor is grounded, and a second terminal of the load resistor is connected to the source of the first MOSFET.

5. The reference voltage buffer circuit according to claim 1, wherein the first MOSFET is an N-type MOSFET, and the second MOSFET is a P-type MOSFET.

6. The reference voltage buffer circuit according to claim 1, wherein the feedback branch comprises a first operational amplifier, a current source, a third MOSFET, a fourth MOSFET and a fifth MOSFET,
wherein a gate of the third MOSFET is connected to a drain of the fifth MOSFET, is connected to an output terminal of the first operational amplifier, and is the first terminal of the feedback branch; a source of the third MOSFET is connected to the current source and is connected to an inverting input terminal of the first operational amplifier; a drain of the third MOSFET is connected to a drain of the fourth MOSFET; a gate of the fourth MOSFET is connected to the gate of the second MOSFET; a source of the fourth MOSFET is connected to the power supply; and a source of the fifth MOSFET is grounded;
in the first time period, a gate of the fifth MOSFET is configured to receive a first signal such that the fifth MOSFET is turned off, and the first operational amplifier is configured to control the gate of the third MOSFET to output the first voltage; and
in the second time period, the gate of the fifth MOSFET is configured to receive a second signal such that the fifth MOSFET is turned on, the output terminal of the first operational amplifier is turned off, and the third MOSFET is turned off.

7. The reference voltage buffer circuit according to claim 6, wherein the first signal is a low-level signal, and the second signal is a high-level signal.

8. The reference voltage buffer circuit according to claim 6, wherein an input voltage of a non-inverting input terminal of the first operational amplifier is equal to the reference voltage.

9. The reference voltage buffer circuit according to claim 6, wherein the feedback branch further comprises a voltage limiting branch, a first terminal of the voltage limiting branch is connected to the gate of the third MOSFET, and a second terminal of the voltage limiting branch is connected to the source of the third MOSFET; and
the voltage limiting branch is configured to limit a gate voltage of the third MOSFET in the first time period according to a source voltage of the third MOSFET.

10. The reference voltage buffer circuit according to claim 9, wherein the voltage limiting branch comprises a second operational amplifier and a sixth MOSFET,
wherein an inverting input terminal of the second operational amplifier is connected to an output terminal of the second operational amplifier and is connected to a drain of the sixth MOSFET, a source of the sixth MOSFET is the first terminal of the voltage limiting branch, and a gate of the sixth MOSFET is the second terminal of the voltage limiting branch;
in the first time period, if the sixth MOSFET is turned on, the second operational amplifier is configured to limit the gate voltage of the third MOSFET; and
in the second time period, the output terminal of the second operational amplifier is turned off.

11. The reference voltage buffer circuit according to claim 10, wherein an input voltage of a non-inverting input terminal of the second operational amplifier is equal to the reference voltage.

12. The reference voltage buffer circuit according to claim 6, wherein the feedback branch further comprises: a status control branch;
a first terminal of the status control branch, the drain of the third MOSFET and the drain of the fourth MOSFET are connected, a second terminal of the status control branch is connected to the gate of the fourth MOSFET, and a third terminal of the status control branch, the third terminal of the delay control branch and the gate of the second MOSFET are connected;
in the first time period, the status control branch is configured to control, according to the first signal, the fourth MOSFET to be turned on, such that the drain of the third MOSFET is connected to the power supply via the fourth MOSFET; and
in the second time period, the status control branch is configured to control, according to the second signal, the drain of the fourth MOSFET and the drain of the third MOSFET to be grounded.

13. The reference voltage buffer circuit according to claim 12, wherein the at least one output branch is one output branch, and the status control branch comprises: a seventh MOSFET, a second NAND gate and a second inverter;
a source of the seventh MOSFET is grounded, a drain of the seventh MOSFET is the second terminal of the status control branch, a gate of the seventh MOSFET is connected to an output terminal of the second NAND gate, the output terminal of the second NAND gate is the first terminal of the status control branch, a first input terminal of the second NAND gate is connected to an output terminal of the second inverter, and an input terminal of the second inverter is the third terminal of the status control branch;
in the first time period, an input signal of a second input terminal of the second NAND gate is opposite to the first signal, such that the second NAND gate controls the seventh MOSFET to be turned off; and
in the second time period, the input signal of the second input terminal of the second NAND gate is opposite to the second signal, such that the second NAND gate controls the seventh MOSFET to be turned on.

14. The reference voltage buffer circuit according to claim 12, wherein the at least one output branch is a plurality of output branches, and the status control branch comprises: a seventh MOSFET, a second NAND gate, and a third NAND gate;
a source of the seventh MOSFET is grounded, a drain of the seventh MOSFET is the second terminal of the status control branch, a gate of the seventh MOSFET is connected to an output terminal of the second NAND gate, the output terminal of the second NAND gate is the first terminal of the status control branch, a first input terminal of the second NAND gate is connected to an output terminal of the third NAND gate, a plurality of input terminals of the third NAND gate are in a one-to-one correspondence with the plurality of output branches, and each input terminal of the third NAND gate is the third terminal of the status control branch and is connected to the third terminal of the delay control branch of each output branch;

in the first time period, an input signal of a second input terminal of the second NAND gate is opposite to the first signal, such that the second NAND gate controls the seventh MOSFET to be turned off; and in the second time period, the input signal of the second input terminal of the second NAND gate is opposite to the second signal, such that the second NAND gate controls the seventh MOSFET to be turned on.

15. The reference voltage buffer circuit according to claim 1, wherein the at least one output branch is a plurality of output branches, and a first output branch in the plurality of output branches comprises a switching component, wherein the first terminal of the feedback branch is connected to a first terminal of the switching component, and a second terminal of the switching component is connected to a first terminal of a delay control branch of the first output branch;

in the first time period, the switching component is turned on, and the feedback branch is configured to output the first voltage to the gate of the first MOSFET via the switching component; and when the switching component is turned off, the feedback branch is disconnected from the gate of the first MOSFET, such that the first MOSFET is turned off and the voltage output by the source of the first MOSFET is 0.

16. The reference voltage buffer circuit according to claim 15, wherein in the second time period, the switching component is turned off.

17. The reference voltage buffer circuit according to claim 15, wherein the switching component comprises an eighth MOSFET and a ninth MOSFET; and a source of the eighth MOSFET is the first terminal of the switching component, a drain of the eighth MOSFET is connected to a drain of the ninth MOSFET, the drain of the ninth MOSFET is the second terminal of the switching component, a source of the ninth MOSFET is grounded, and a gate of the eighth MOSFET and a gate of the ninth MOSFET are configured to receive signals, such that the switching component is turned on or off.

18. The reference voltage buffer circuit according to claim 17, wherein the eighth MOSFET is a P-type MOSFET, and the ninth MOSFET is an N-type MOSFET; or the eighth MOSFET is an N-type MOSFET, and the ninth MOSFET is a P-type MOSFET; and a signal input to the gate of the eighth MOSFET is the same as a signal input to the gate of the ninth MOSFET.

19. The reference voltage buffer circuit according to claim 1, wherein a voltage of the power supply is greater than the reference voltage, and the first voltage is greater than the reference voltage.

20. The reference voltage buffer circuit according to claim 1, wherein the source of the first MOSFET is configured to provide the reference voltage to an analog-to-digital converter.

* * * * *